US011158807B2

(12) United States Patent
Vasen et al.

(10) Patent No.: US 11,158,807 B2
(45) Date of Patent: Oct. 26, 2021

(54) FIELD EFFECT TRANSISTOR AND METHOD OF MANUFACTURING THE SAME

(71) Applicant: Taiwan Semiconductor Manufacturing Co., Ltd., Hsinchu (TW)

(72) Inventors: Timothy Vasen, Tervuren (BE); Chao-Ching Cheng, Hsinchu (TW); Matthias Passlack, Huldenberg (BE); Martin Christopher Holland, Bertem (BE); Tse-An Chen, Taoyuan (TW); Lain-Jong Li, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/656,583

(22) Filed: Oct. 18, 2019

(65) Prior Publication Data

US 2021/0119131 A1    Apr. 22, 2021

(51) Int. Cl.
*H01L 51/00* (2006.01)
*H01L 51/05* (2006.01)

(52) U.S. Cl.
CPC ...... *H01L 51/0048* (2013.01); *H01L 51/0045* (2013.01); *H01L 51/057* (2013.01); *H01L 51/0525* (2013.01); *H01L 51/0529* (2013.01); *H01L 51/0533* (2013.01); *H01L 51/0537* (2013.01)

(58) Field of Classification Search
CPC ............. H01L 51/0045; H01L 51/0048; H01L 51/057; H01L 51/0041; H01L 51/052; H01L 51/0525; H01L 51/0529; H01L 51/0533; H01L 51/0537

USPC .......................................................... 257/40
See application file for complete search history.

(56) References Cited

U.S. PATENT DOCUMENTS

| 9,922,825 B2* | 3/2018 | Lee | H01L 29/66742 |
|---|---|---|---|
| 2009/0189152 A1* | 7/2009 | Cho | B82Y 10/00 257/40 |
| 2010/0108981 A1* | 5/2010 | Jayasekara | H01L 45/04 257/5 |
| 2011/0233513 A1* | 9/2011 | Dimitrakopoulos | H01L 29/7781 257/9 |
| 2014/0291607 A1* | 10/2014 | Kim | H01L 29/1606 257/9 |

(Continued)

OTHER PUBLICATIONS

Damon B. Farmer, et al., "Atomic Layer Deposition on Suspended Single-Walled Carbon Nanotubes via Gas-Phase Noncovalent Functionalization", Nano Letters, vol. 6, No. 4, Mar. 4, 2006, pp. 699-703.

(Continued)

*Primary Examiner* — Matthew E Warren
(74) *Attorney, Agent, or Firm* — JCIPRNET

(57) ABSTRACT

A field effect transistor includes a semiconductor substrate, a first pad layer, carbon nanotubes and a gate structure. The first pad layer is disposed over the semiconductor substrate and comprises a 2D material. The carbon nanotubes are disposed over the first insulating pad layer. The gate structure is disposed over the semiconductor substrate and is vertically stacked with the carbon nanotubes. The carbon nanotubes extend from one side to an opposite side of the gate structure.

20 Claims, 25 Drawing Sheets

(56) References Cited

U.S. PATENT DOCUMENTS

2019/0097000 A1* 3/2019 Berry ............... H01L 21/02458
2019/0273166 A1* 9/2019 Venugopal ............ H01L 29/778

OTHER PUBLICATIONS

Iljo Kwak, et al., "Low interface trap density in scaled bilayer gate oxides on 2D materials via nanofog low temperature atomic layer deposition", Applied Surface Science, vol. 463, Jan. 1, 2019, pp. 758-766.
Nishant Patil, et al., "Wafer-Scale Growth and Transfer of Aligned Single-Walled Carbon Nanotubes", IEEE Transactions on Nanotechnology, vol. 8, No. 4, Jul. 2009, pp. 498-504.
Max M. Shulaker, et al., "High-Performance Carbon Nanotube Field-Effect Transistors", IEEE International Electron Devices Meeting, Dec. 2014, pp. 1-4.
M Waqas Iqbal, et al., "High-mobility and air-stable single-layer WS2 field-effect transistors sandwiched between chemical vapor deposition-grown hexagonal BN films", Scientific Reports, Jun. 1, 2015, pp. 1-9.
Tathagata Srimani, et al., "30-nm Contacted Gate Pitch Back-Gate Carbon Nanotube FETs for Sub-3-nm Nodes", IEEE Transactions on Nanotechnology, vol. 18, 2019, pp. 132-138.

* cited by examiner

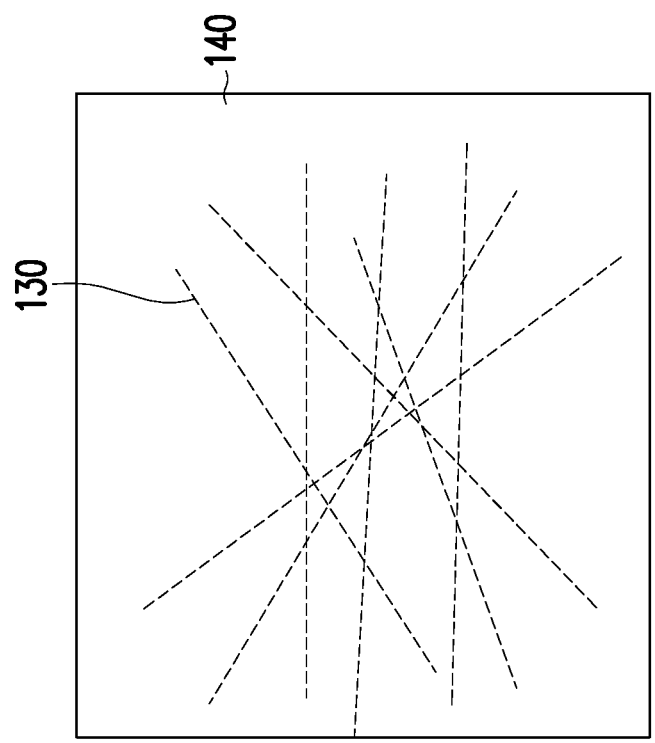
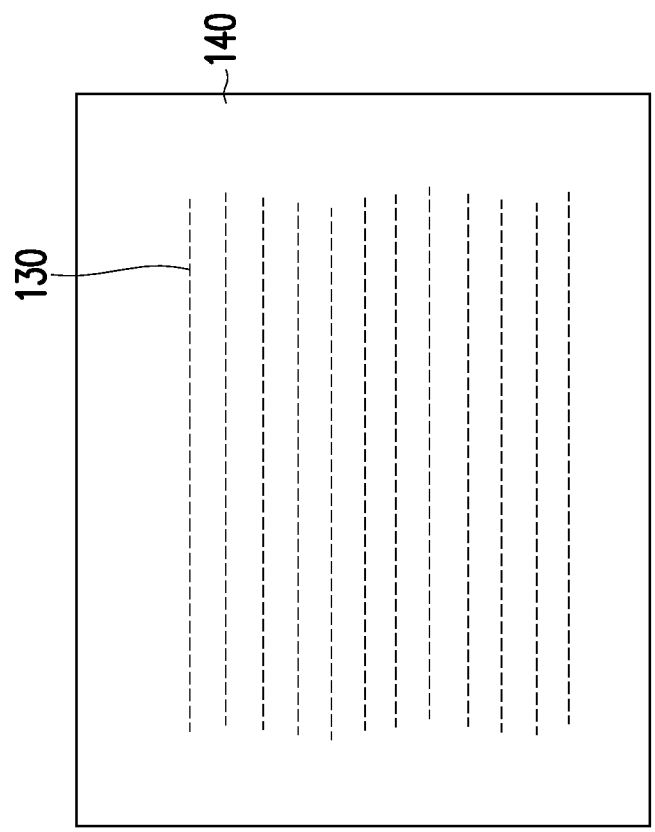
FIG. 4B
FIG. 4A

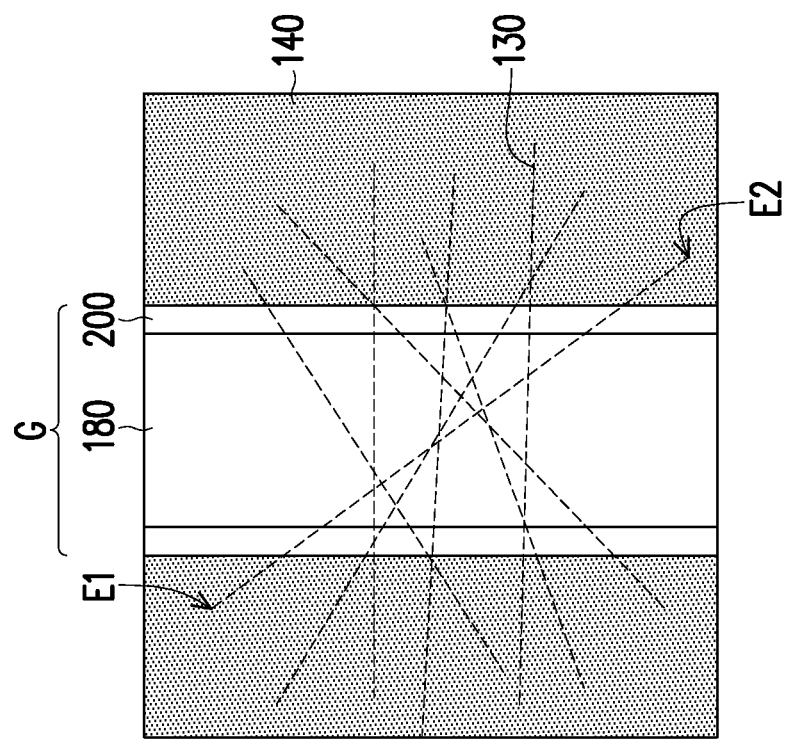
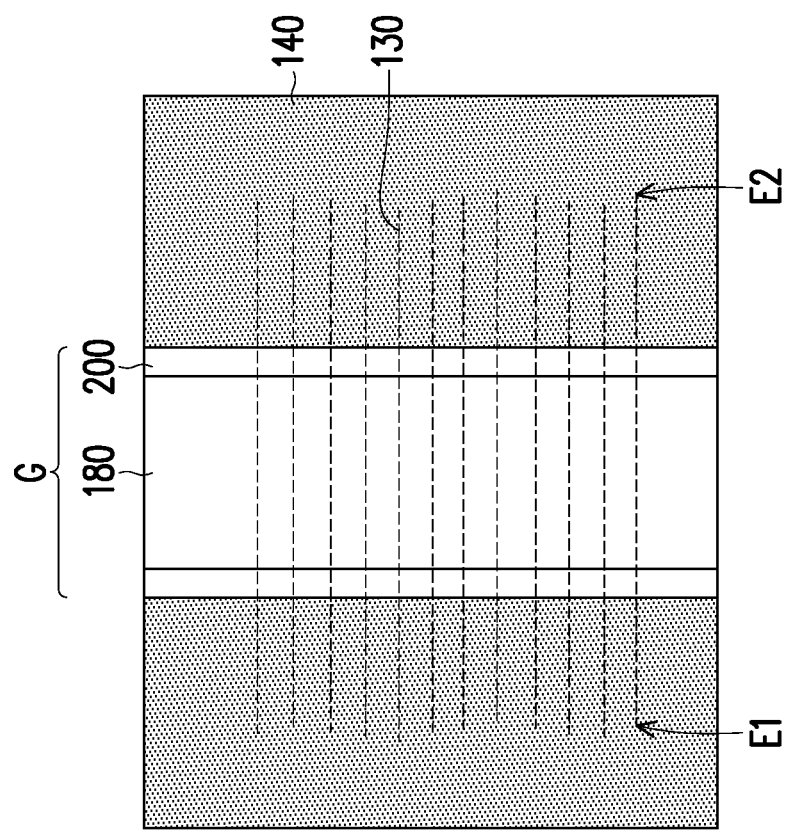
FIG. 7B
FIG. 7A

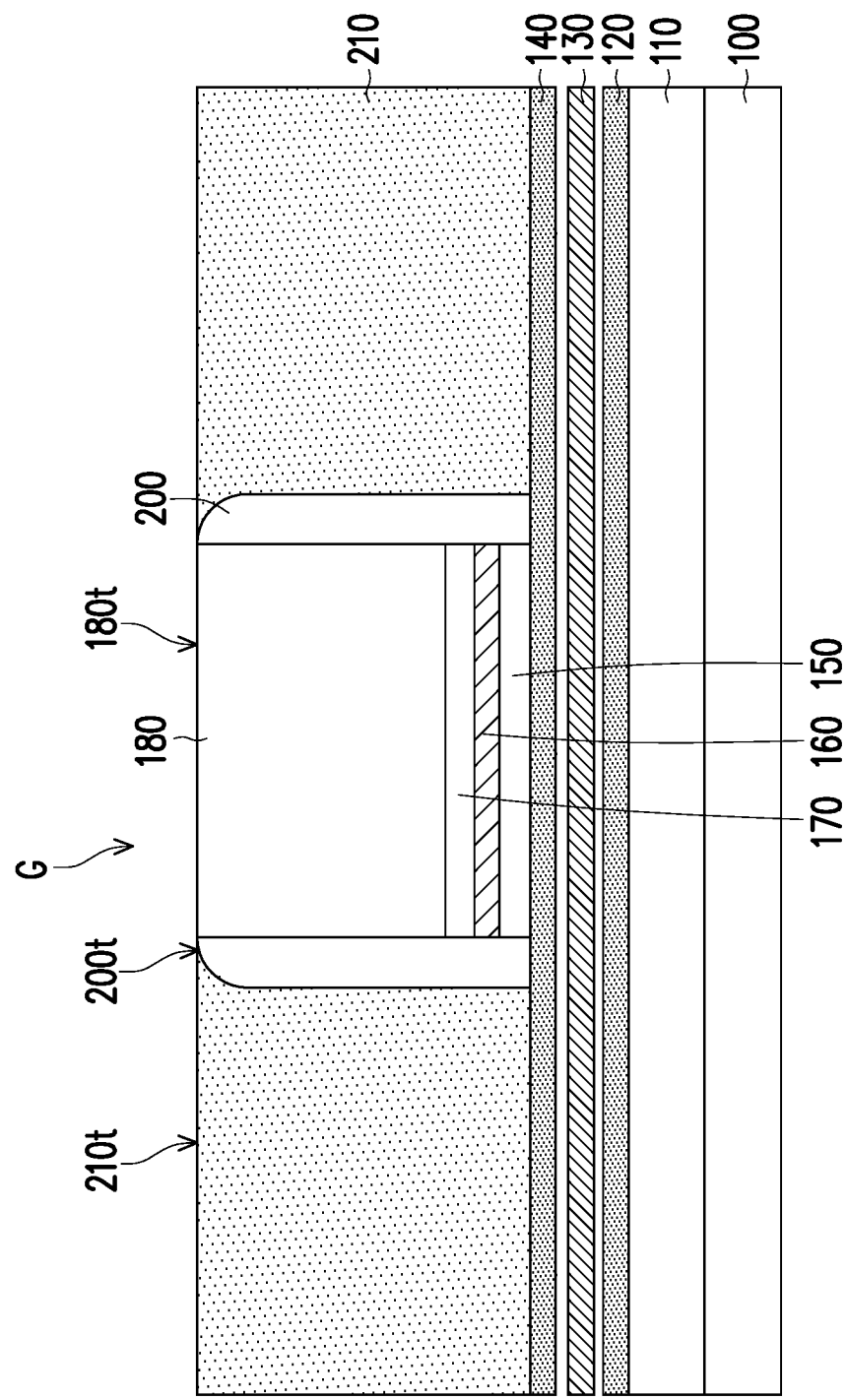

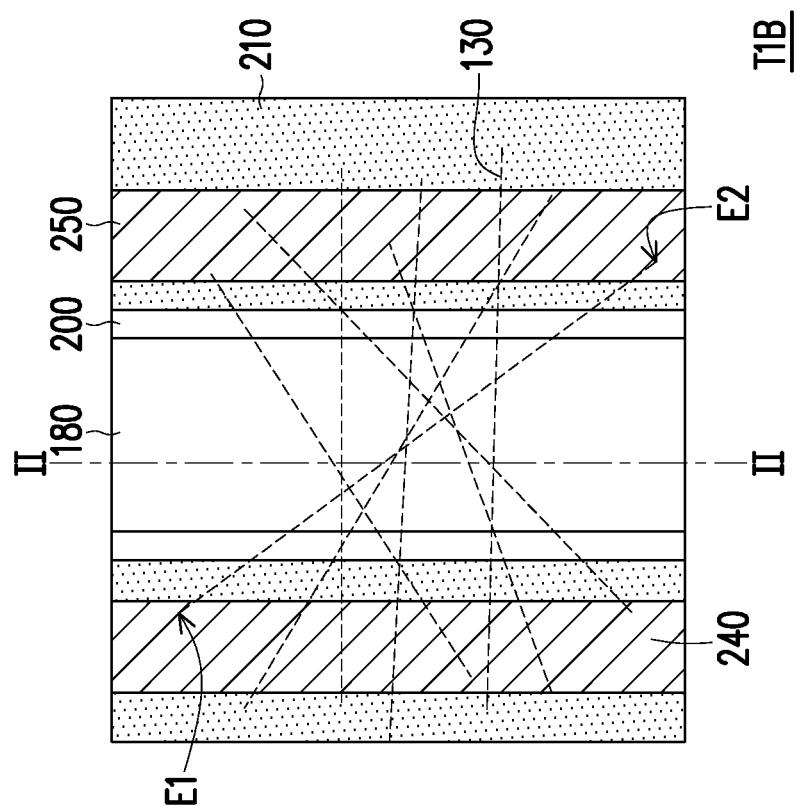
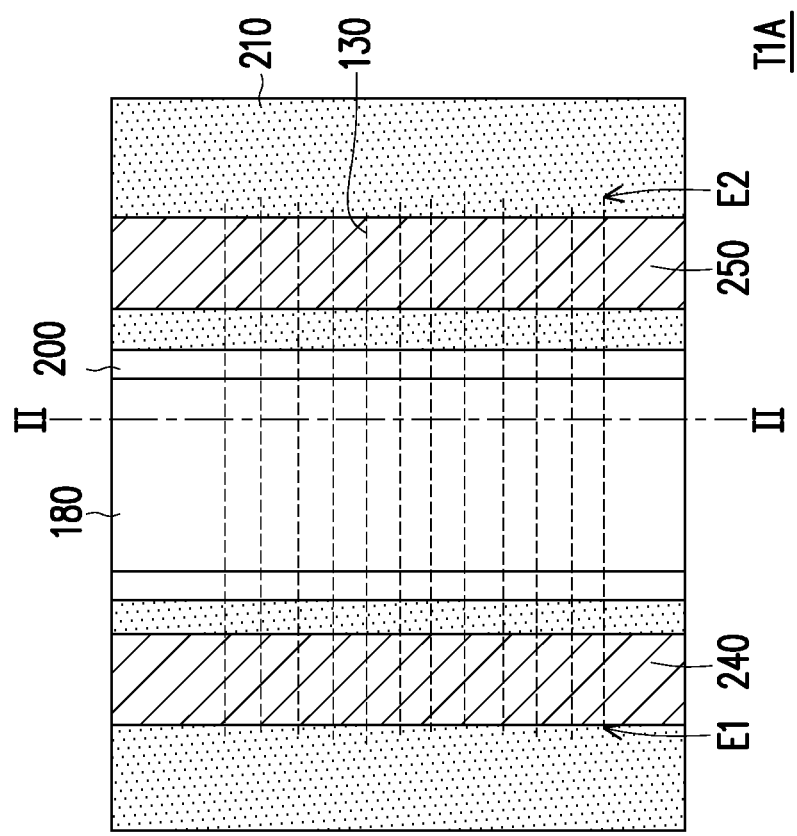

FIELD EFFECT TRANSISTOR AND METHOD OF MANUFACTURING THE SAME

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. New approaches to allow further scaling down of IC devices are actively researched.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 to FIG. 10 are schematic cross-sectional views of structures produced during a manufacturing method of a field effect transistor according to some embodiments of the present disclosure.

FIGS. 3A, 4A, 5A, 7A, 8A, 9A and 10A are schematic top views of structures respectively shown in FIGS. 3, 4, 5, 7, 8, 9 and 10 according to some embodiments of the present disclosure.

FIGS. 3B, 4B, 5B, 7B, 8B, 9B and 10B are schematic top views of structures respectively shown in FIGS. 3, 4, 5, 7, 8, 9 and 10 according to some embodiments of the present disclosure.

DETAILED DESCRIPTION

Figure 1:
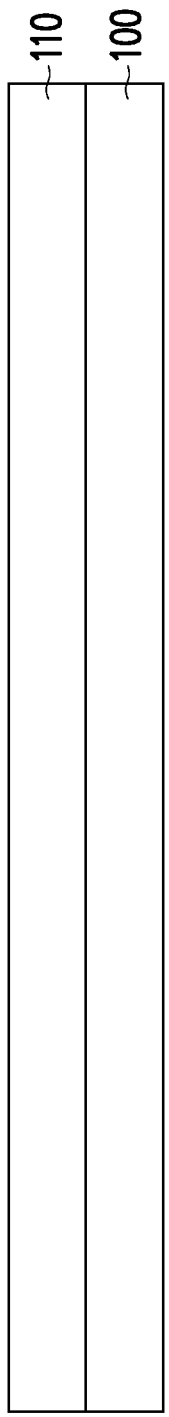

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the disclosure describe exemplary manufacturing processes of field effect transistors (FETs) and the FETs fabricated there-from. In certain embodiments of the disclosure, the FETs may be formed on bulk silicon substrates. Still, the FETs may be formed on a silicon-on-insulator (SOI) substrate, a germanium-on-insulator (GOI) substrate, a SiGe substrate, or a Group III-V semiconductor substrate. Also, in accordance with some embodiments of the disclosure, the substrate may include other conductive layers or other semiconductor elements, such as transistors, diodes or the like. The embodiments are not limited in this context. Other transistor geometries than the ones illustrated in the drawings, such as back-gate field effect transistors, are contemplated within the scope of the disclosure. The field effect transistor may be included in a microprocessor, memory cell, and/or other integrated circuits (IC). In addition, the transistors of the present disclosure may be further processed using CMOS technology processing. Accordingly, it is understood that additional processes may be provided before, during, and after the illustrated method, and that some other processes may only be briefly described herein. Also, the structures illustrated in the drawings are simplified for a better understanding of the concepts of the present disclosure. For example, although the figures illustrate the structure of a field effect transistor, it is understood the field effect transistor may be part of an IC that further includes a number of other devices such as resistors, capacitors, inductors, fuses, etc.

FIG. 1 to FIG. 10 are schematic cross-sectional views of structures produced during a manufacturing method of a field effect transistor according to some embodiments of the present disclosure. FIGS. 3A, 4A, 5A, 7A, 8A, 9A and 10A are schematic top view of the structures illustrated in the corresponding views of FIGS. 3, 4, 5, 7, 8, 9 and 10 according to some embodiments of the disclosure. FIGS. 3B, 4B, 5B, 7B, 8B, 9B and 10B are schematic top view of the structures illustrated in the corresponding views of FIGS. 3, 4, 5, 7, 8, 9 and 10 according to some alternative embodiments of the disclosure. Referring to FIG. 1, a semiconductor substrate 100 is provided. In some embodiments, the semiconductor substrate 100 includes a crystalline silicon substrate or a bulk silicon substrate (e.g., wafer). The semiconductor substrate 100 may include various doped regions depending on design requirements (e.g., p-type semiconductor substrate or n-type semiconductor substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FET, or alternatively, configured for a p-type FET. In some embodiments, the semiconductor substrate 100 may be made of a suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor substrate 100 includes a silicon on insulator (SOI) substrate.

As shown in FIG. 1, a dielectric layer 110 may be formed on the semiconductor substrate 100. In some embodiments, the dielectric layer 110 is blanketly formed over the semiconductor substrate 100 (or a region of the semiconductor substrate 100). In some embodiments, the dielectric layer 110 includes silicon oxide, silicon nitride, silicon oxynitride, fluoride-doped silicate glass (FSG), a spin-on dielectric material, a low-k dielectric material, other suitable dielectric materials, or a combination thereof. In some embodiments, low-k dielectric materials are dielectric materials having a dielectric constant lower than 3.9. In some embodiments, the dielectric layer 110 includes silicon oxide. The dielectric layer 110 may be formed by high-density-plasma chemical vapor deposition (HDP-CVD), sub-atmospheric CVD (SACVD), spin-on coating, or other suitable techniques. The thickness of the dielectric layer 110 is not particularly limited. In some embodiments, the thickness of the dielectric layer 110 is in the range from 5 to 100 nanometers.

Figure 2:
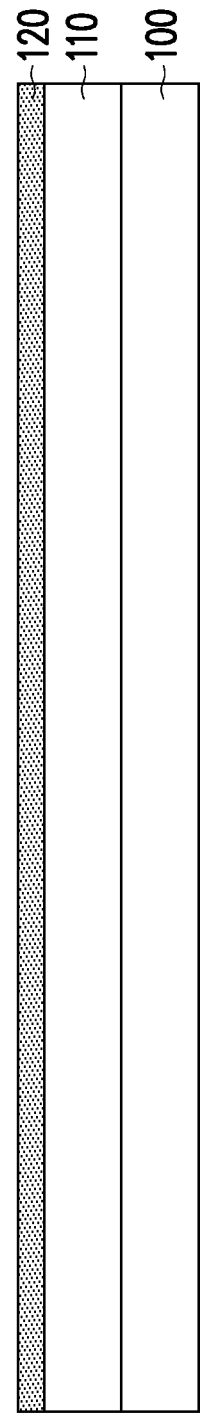

Referring to FIG. 2, in some embodiments a pad layer 120 is provided over the dielectric layer 110. In some embodiments, the pad layer 120 includes a two-dimensional insulator material, such as hexagonal boron nitride, aluminum nitride, or the like. In some embodiments, the pad layer 120 is formed by an atomically thin sheet of hexagonal boron nitride. In some alternative embodiments, the pad layer 120 is formed by multiple sheets of hexagonal boron nitride. In some embodiments, sheets of hexagonal boron nitride are grown on separate substrates (not shown) and then transferred on the dielectric layer 110. For example, a hexagonal boron nitride film (not shown) may be grown on growth substrate including conductive material (e.g., copper) using chemical vapor deposition. In some embodiments, hexagonal boron nitride may be prepared by reaction of one or more precursor at elevated temperatures. In some embodiments, the hexagonal boron nitride film may be transferred on the dielectric layer 110 via a sacrificial polymeric film (not shown).

Figure 3:
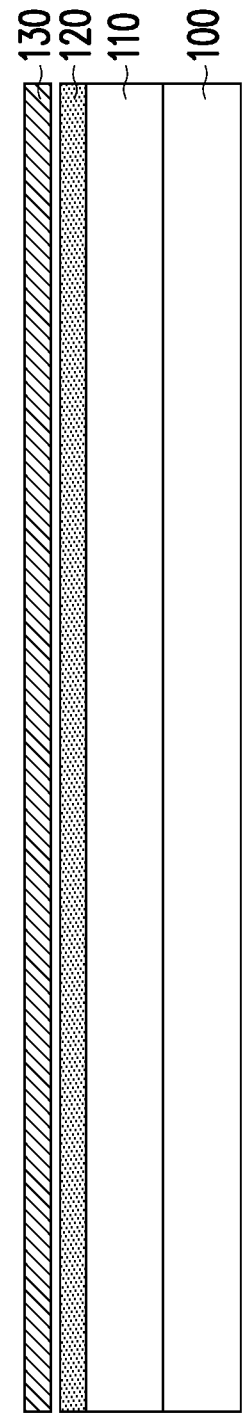
Figure 3B:
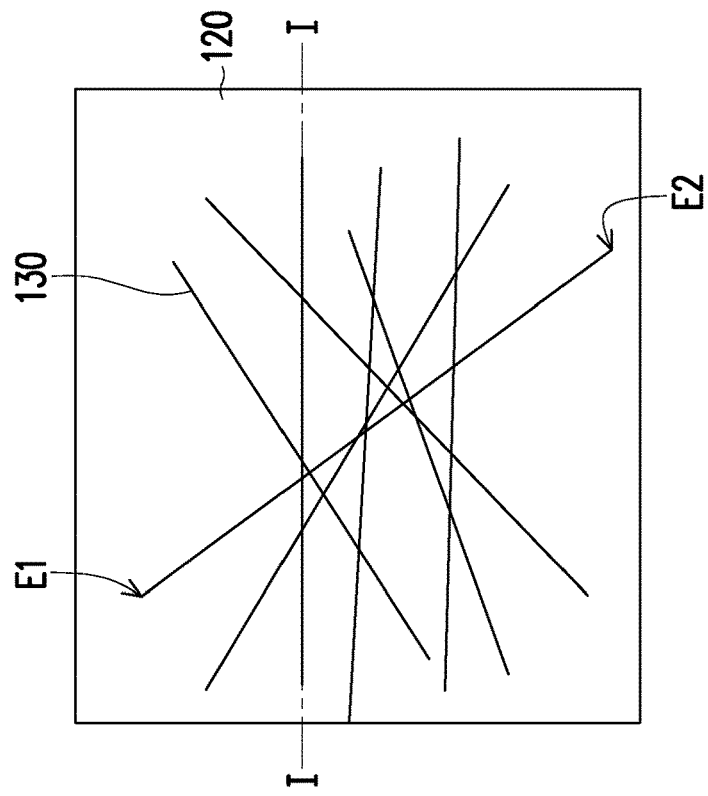
Figure 3A:
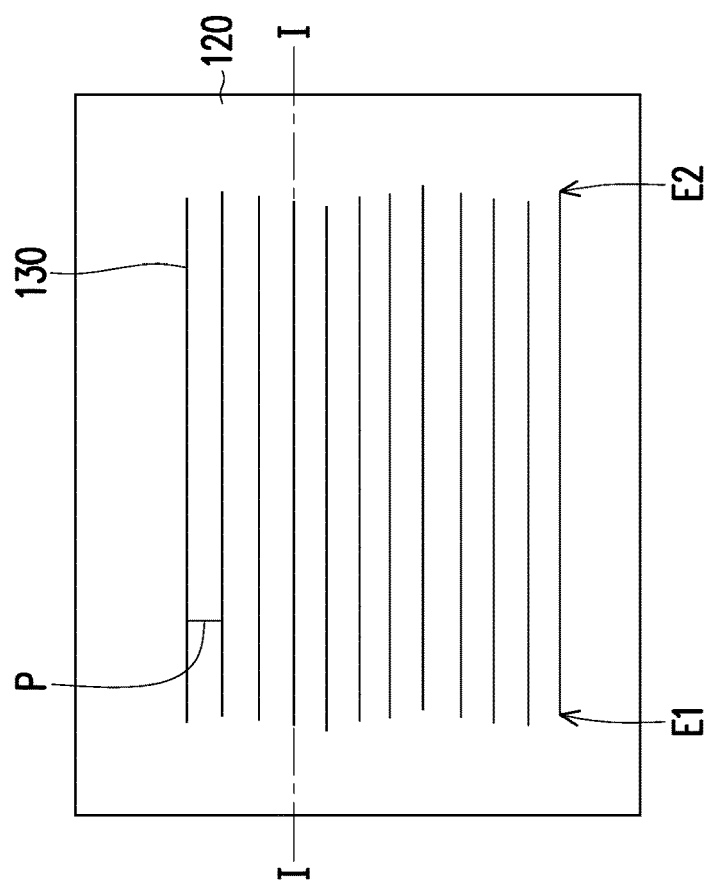

Referring to FIG. 3, in some embodiments carbon nanotubes 130 are provided on the pad layer 120. In some embodiments, the carbon nanotubes 130 are of the semiconducting type. In some embodiments, the length of the carbon nanotubes 130 (the distance from one end E1 to the other end E2 of a carbon nanotube 130) is in the range from 30 nm to 100 μm. In some embodiments, the diameter of the carbon nanotubes 130 is in the range from 0.8 to 1.4 nanometers. In some alternative embodiments, the carbon nanotubes 130 are disposed on the pad layer 120 (substantially on the same plane) along substantially parallel directions, in a so-called aligned configuration, as illustrated in the top view of FIG. 3A. In the aligned configuration, the carbon nanotubes 130 may extend along a first direction, and be disposed with a pitch P along a second direction perpendicular to the first direction. In some embodiments, the pitch P may be in the range from 2 nm to 10 nm. In one embodiment, the first direction is the direction along the section line I-I as shown in FIG. 3A. In some alternative embodiments, the carbon nanotubes 130 on the pad layer 120 may extend in various directions over substantially the same plane on top of the pad layer 120, in a so-called random configuration, as illustrated in the top view of FIG. 3B. In the random configuration, the carbon nanotubes 130 may cross over each other, thus partially overlapping. In some alternative embodiments, the carbon nanotubes 130 may extend in various directions without overlapping. That is, the carbon nanotubes 130 do not contact one another but if prolonged beyond the ends of the carbon nanotubes 130 their extension lines might intersect one another. In both configurations, the first end E1 of each carbon nanotube 130 is located on a first side of the pad layer 120, and the second end E2 of each carbon nanotube 130 is located on a second side of the pad layer 120, and the carbon nanotubes 130 extend from the first side to the second side. The cross-sectional views of FIG. 1 to FIG. 10 are taken along one of the carbon nanotubes 130, e.g., along the section lines I-I of FIG. 3A and FIG. 3B. For the sake of simplicity, the carbon nanotubes 130 are illustrated as a solid filled layer in the cross-sectional views of FIG. 1 to FIG. 10.

Figure 4:
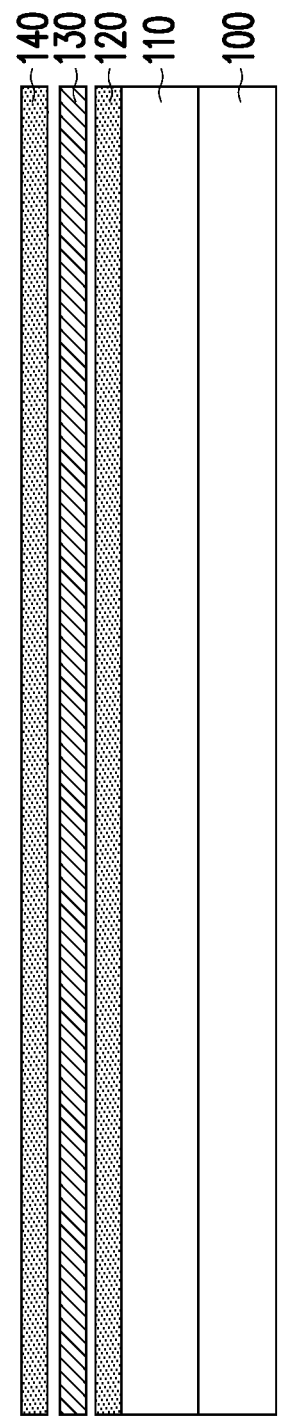

In some embodiments, referring to FIG. 4, FIG. 4A and FIG. 4B, a pad layer 140 is disposed over the pad layer 120 to cover the carbon nanotubes 130. In some embodiments, the pad layer 140 includes the same or similar materials as the pad layer 120 and is provided in the same or similar manner. For example, the pad layer 120 and the pad layer 140 may both be hexagonal boron nitride sheets. In some embodiments, the carbon nanotubes 130 are sandwiched between the pad layer 120 and the pad layer 140. In some embodiments, the pad layer 140 conformally covers the carbon nanotubes 130. In some embodiments, the carbon nanotubes 130 and the pad layers 120 and 140 are formed by substantially two-dimensional insulating materials, e.g., aluminum nitride or hexagonal boron nitride, and do not present dangling bonds. In some embodiments, depending on the nature of the materials used, van der Waals gaps may be present at the interfaces between the carbon nanotubes 130 and the pad layers 120 and 140. This is schematically represented in the cross-sectional views of FIG. 3 to FIG. 10 by the gap between the pad layer 120 and the carbon nanotubes 130 and between the carbon nanotubes 130 and the pad layer 140. In the top views of FIG. 4A and FIG. 4B the positions of the carbon nanotubes 130 is shown by dashed lines, even though they may be covered by the pad layer 140.

Figure 5:
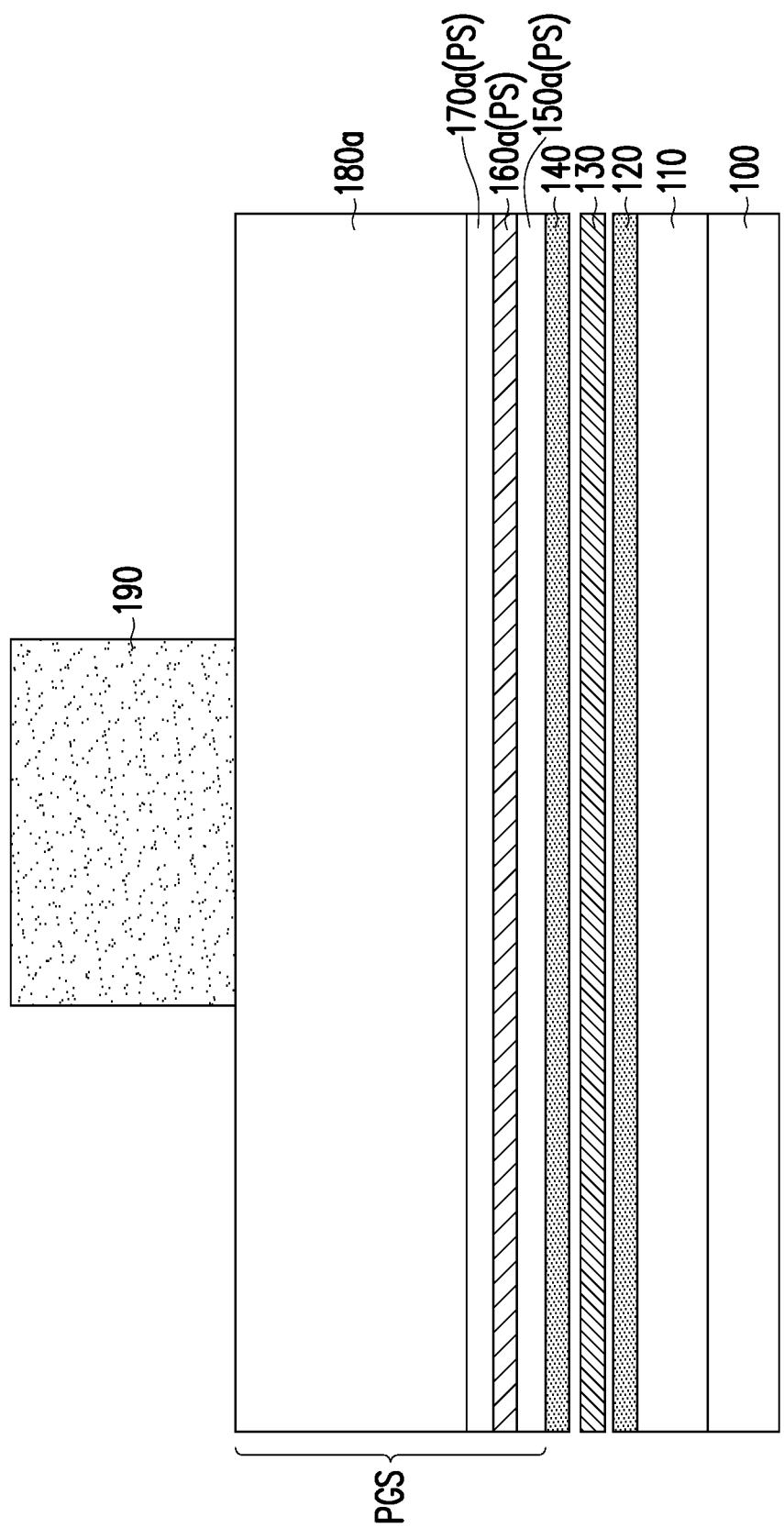
Figure 5B:
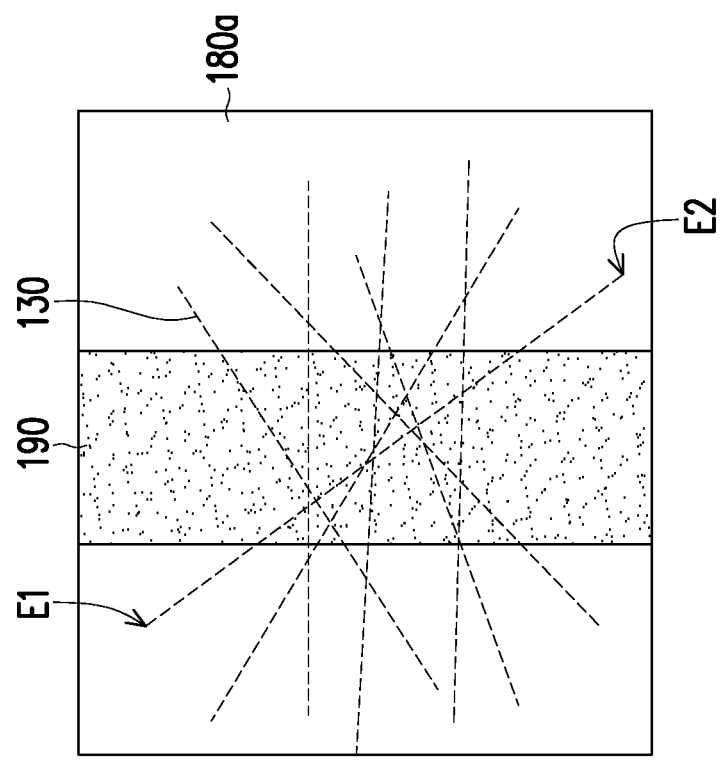
Figure 5A:
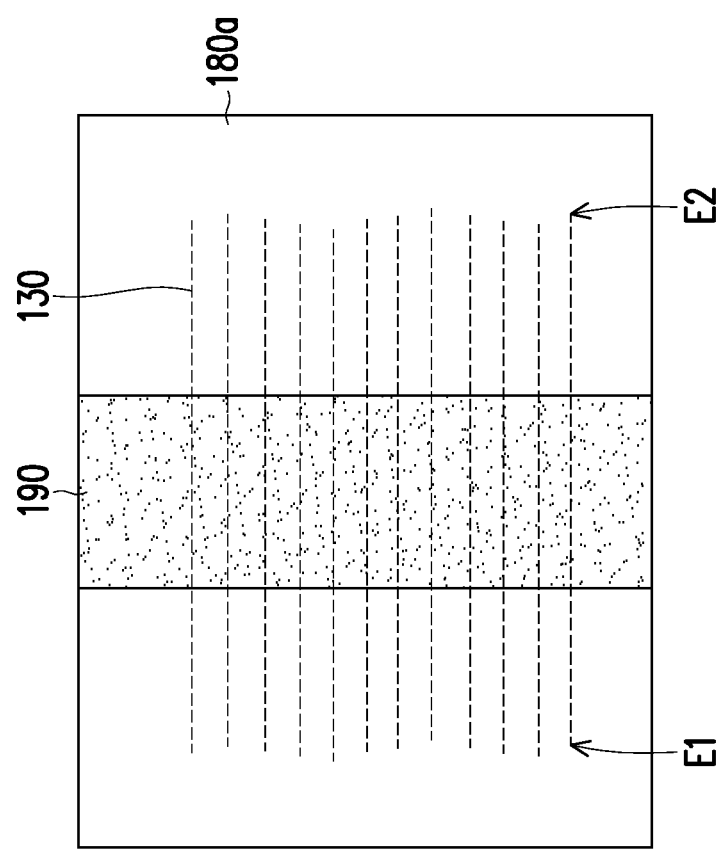

Referring to FIG. 5, FIG. 5A and FIG. 5B, in some embodiments a precursor gate structure PGS may be formed on the pad layer 140. In some embodiments, the precursor gate structure PGS includes a precursor strip PS and a precursor gate electrode 180a disposed on the precursor strip PS. In certain embodiments, the precursor strip PS includes a high-k dielectric strip 160a and a work function metal strip 170a. In certain embodiments, an insulation material strip 150a is optionally formed, conformally covering the pad layer 140 before the step of forming the high-k dielectric strip 160a, so as to increase the adhesion between the high-k dielectric strip 160a and the pad layer 140. The insulation material strip 150a may include a dielectric material such as silicon oxide, silicon oxynitride (SiON), HfO$_2$, Al$_2$O$_3$, ZrO$_2$ or other gate dielectric materials. In some embodiments, the insulation material strip 150a may be formed by a deposition process such as atomic layer deposition (ALD), chemical vapor deposition (CVD), and/or other suitable deposition methods.

In some embodiments, the high-k dielectric strip 160a and the work function metal strip 170a are sequentially formed on the pad layer 140 over the carbon nanotubes 130. In some embodiments, after conformally forming the high-k dielectric strip 160a over the carbon nanotubes 130 and the pad layer 140, the work function metal strip 170a is then formed on the high-k dielectric strip 160a in a conformal manner. In some embodiments, the high-k dielectric strip 160a includes a high-k dielectric material. The high-k dielectric material has a k (dielectric constant) value greater than about 7.0 and includes a metal oxide or a silicate of hafnium (Hf), aluminum (Al), zirconium (Zr), lanthanum (La), magnesium (Mg), barium (Ba), titanium (Ti), lead (Pb), or combinations thereof. In some embodiments, the method of forming the high-k dielectric strip 160a includes performing at least one suitable deposition technique, such as CVD, PECVD, metal oxide chemical vapor deposition (MOCVD), ALD, remote plasma atomic layer deposition (RPALD), plasma-enhanced atomic layer deposition (PEALD), molecular beam deposition (MBD), or the like. In certain embodiments, the material of the work function metal strip 170a includes TiN, TaC, TaCNO, TaCN, TiAl, TaN or combinations thereof. The method of forming the work function metal strip 170a includes performing an ALD process, or a CVD process, for example. In one embodiment, the high-k dielectric strip 160a includes HfO$_2$ and the work function metal strip 170a includes TiN. The material of the work function metal strip 170a is chosen to have a desired work function value depending on the requirements of the product, and is not limited by the above-mentioned materials.

In some embodiments, the insulation material strip 150a, the high-k dielectric strip 160a and the work function metal strip 170a conformally cover the carbon nanotubes 130 and the pad layer 140. In some embodiments, both the carbon nanotubes 130 and the pad layer 140 present atomically flat surfaces, without dangling bond. In some embodiments, the absence of dangling bonds may hinder the subsequent deposition of dielectric materials (e.g., the insulation material strip 150a or the high-k dielectric strip 160a). In some embodiments, the structure of the pad layer 140 may be locally damaged (e.g., breaking the two-dimensional lattice formed by the boron and nitrogen atoms), to provide nucleation sites for the deposition of dielectric materials. In some embodiments, the lattice of the pad layer 140 is broken in a site removed from where the carbon nanotubes 130 are disposed. Alternatively stated, by providing the pad layer 140, it is possible to promote nucleation of the gate dielectric materials over the carbon nanotubes 130 without damaging the carbon nanotubes 130. Therefore, the FETs can be conveniently fabricated without negatively affecting the electronic properties of the carbon nanotubes 130.

In some embodiments, the precursor gate electrode 180a is formed on the precursor strip PS. In some embodiments, the precursor gate electrode 180a includes a polysilicon layer. In some alternative embodiments, the precursor gate electrode 180a includes a gate electrode material for a final gate structure. For example, the gate electrode material may include titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material, or a combination thereof. A hard mask 190 may be formed on the precursor gate electrode 180a. As illustrated in FIG. 5A and FIG. 5B, the hard mask 190 may be disposed over the carbon nanotubes 130 in such a manner that the two ends E1 and E2 of each carbon nanotube 130 are located on opposite sides of the hard mask 190. In one embodiment, the material of the hard mask 190 includes silicon oxide, silicon nitride or silicon oxynitride. The method of forming the hard mask 190 includes performing a CVD process or a PVD process, for example.

Figure 6:
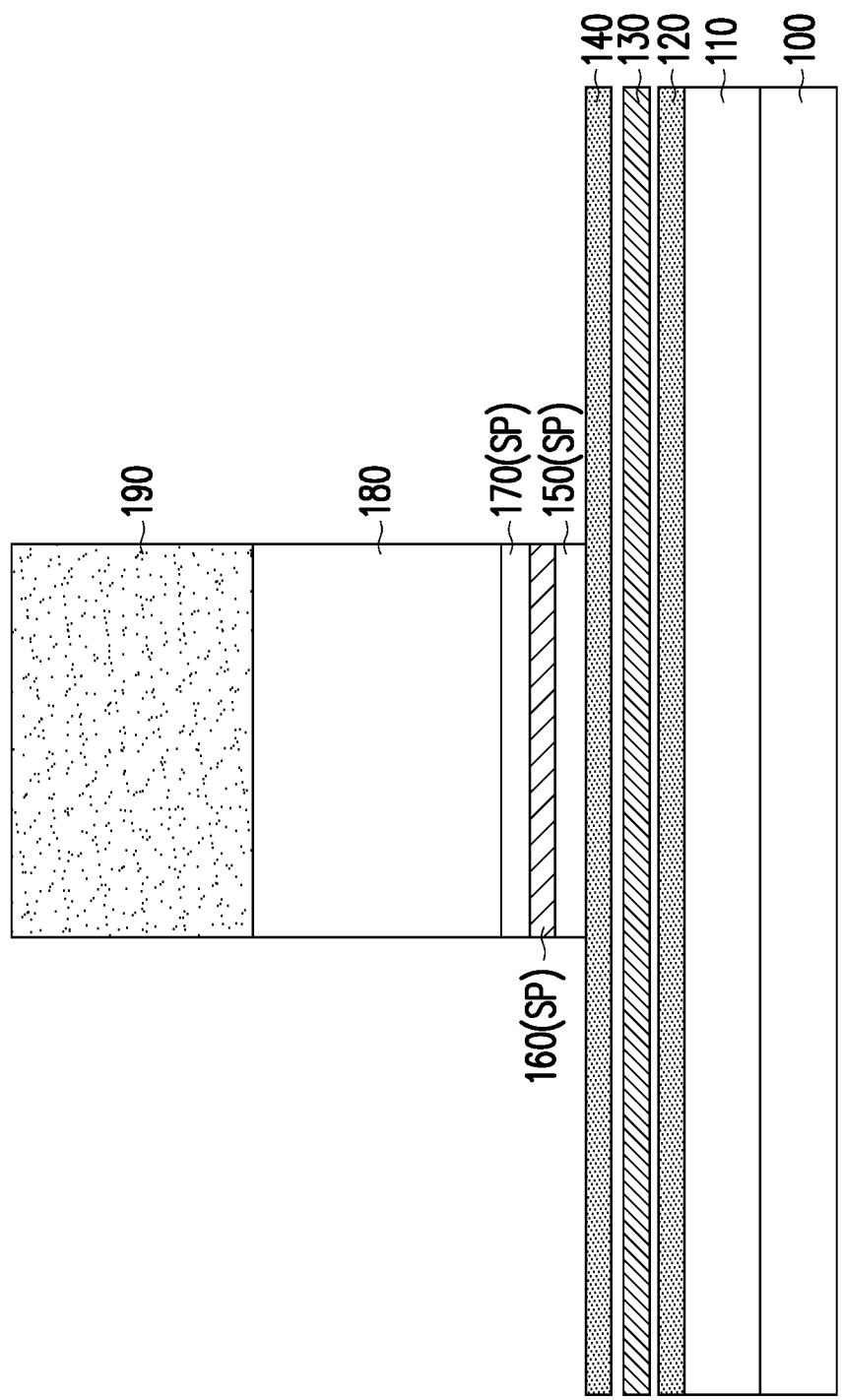

Referring to FIG. 5 and FIG. 6, in some embodiments, the precursor gate electrode 180a is patterned to form the gate electrode 180 by transferring the pattern of the hard mask 190. Upon formation of the gate electrode 180, the underlying work function metal strip 170a is partially exposed. In some embodiments, the patterning of the precursor gate electrode 180a includes performing at least one anisotropic etching process. In certain embodiments, the gate electrode 180 functions as dummy gate, defining the location of subsequently formed replacement gate structures. In some embodiments, using the gate electrode 180 and the hard mask 190 as masks, the underlying work function metal strip 170a, high-k dielectric strip 160a and insulation material strip 150a (if included) are sequentially patterned to form the work function metal layer 170, the high-k dielectric layer 160, and the insulation material layer 150. These layers are sequentially stacked below the gate electrode 180, and form a stacked strip SP. That is, the stacked insulation material layer 150, high-k dielectric layer 160 and work function metal layer 170 may be collectively referred to as a stacked strip SP. In some embodiments, the stacked strip SP is disposed on the pad layer 140. The patterning of the work function metal strip 170a and high-k dielectric strip 160a includes performing one or more anisotropic etching processes, for example. In some embodiments, upon formation of the stacked strip SP the pad layer 140 is partially exposed. In some embodiments, the gate electrode 180 and the stacked strip SP may be in a strip shape and extended in a direction perpendicular to the extending direction of the underlying carbon nanotubes 130, when the carbon nanotubes 130 are in the aligned configuration, as shown in FIG. 7A. In some embodiments, the gate electrode 180 and the stacked strip SP may be in a strip shape and extended in a direction at different angles with the various extending directions of the underlying carbon nanotubes 130, when the carbon nanotubes 130 are in the random configuration, as shown in FIG. 7B.

In certain embodiments, the hard mask 190 includes several separate strip patterns, so that multiple stacks including one gate electrode 180 and one stacked strip SP separate from one another are formed, for example over separate groups of carbon nanotubes 130 disposed on different regions of the semiconductor substrate 100.

Figure 7:
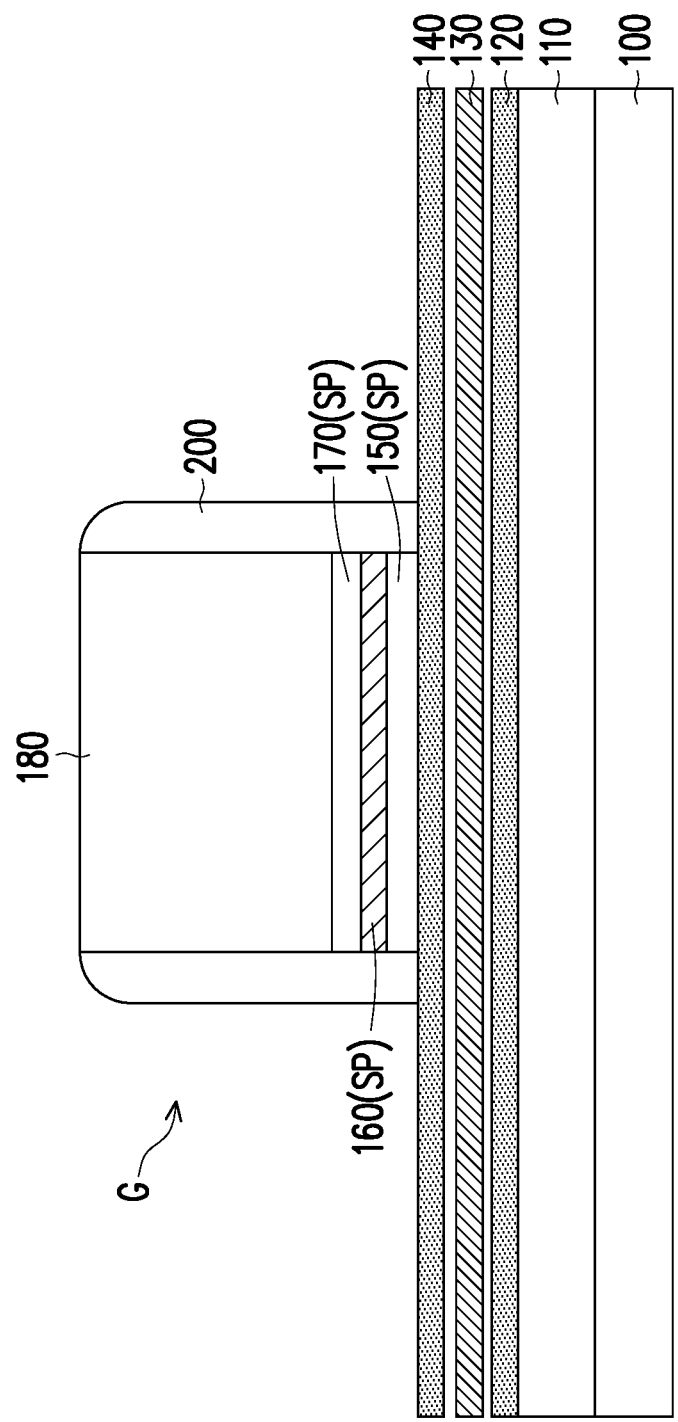

Referring to FIG. 7, FIG. 7A and FIG. 7B, in some embodiments, the hard mask 190 is removed and the spacers 200 are formed beside the gate electrode 180 and the stacked strip SP on the pad layer 140. In certain embodiments, the spacers 200 extend on opposite sidewalls of the gate electrode 180. In some embodiments, the spacers 200 are connected at opposite line-ends of the gate electrode 180 and form a ring structure or an enclosed wall structure surrounding the gate electrode 180 and the stacked strip SP. In some embodiments, the spacers 200 are formed of a dielectric material, such as silicon oxide, silicon nitride, carbonized silicon nitride (SiCN), SiCON, or a combination thereof. The spacers 200 may be a single layer or a multilayered structure. In some embodiments, the spacers 200 are formed by depositing a blanket layer of a dielectric material (not shown) and performing an anisotropic etching process and/or a planarization process to remove the extra dielectric material and the hard mask 190, so as to form the spacers 200 on the sidewalls of the gate electrode 180 and the stacked strip SP. The hard mask 190 is removed before or along with the formation of spacers 200. In some embodiments, with the fabrication of the spacers 200 a gate structure G is formed. In some embodiments, the spacers 200 are formed so as to not overlap with the extremities E1 and E2 of the carbon nanotubes 130. That is, at least a portion of the several carbon nanotubes 130 extends beyond the spacers 200 on opposite sides of the gate structure G. In some embodiments, the gate structure G may further include barrier layers, work function layers, liner layers, interface layers, seed layers, adhesion layers, etc.

Figure 8B:
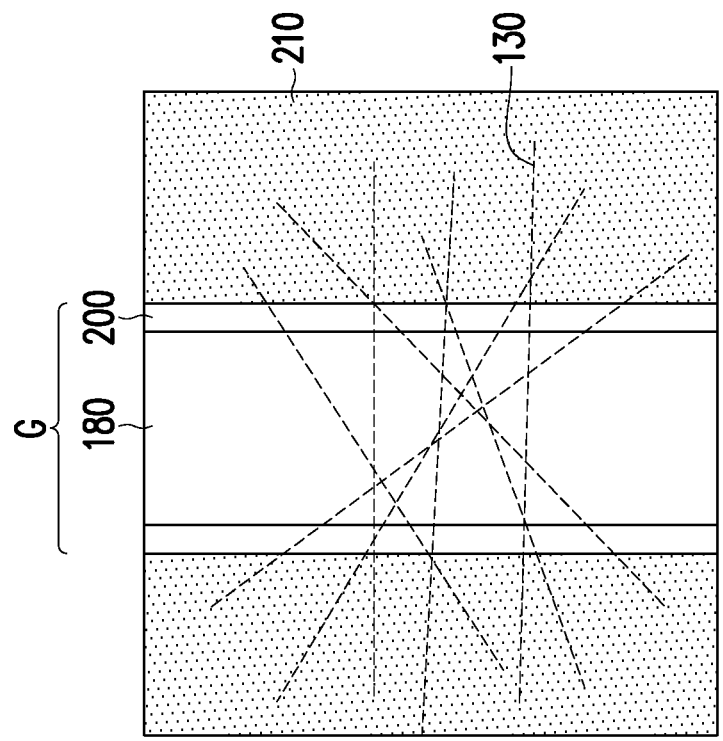
Figure 8A:
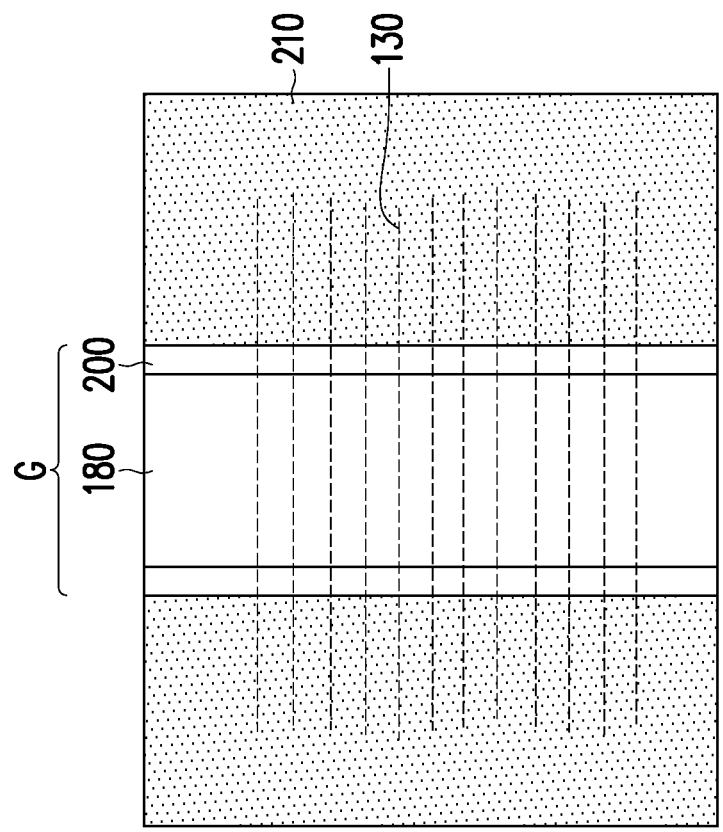

Referring to FIG. 8, FIG. 8A and FIG. 8B, an interlayer dielectric layer 210 is formed on the pad layer 140 surrounding the spacers 200. In other words, the interlayer dielectric layer 210 is formed adjacent to the spacers 200 and around the gate structure G. In some embodiments, a material of the interlayer dielectric layer 210 includes low-k dielectric materials. Examples of low-k dielectric materials include Xerogel, Aerogel, amorphous fluorinated carbon, parylene, BCB (bis-benzocyclobutenes), flare, hydrogen silsesquioxane (HSQ), fluorinated silicon oxide (SiOF), or a combination thereof. It is understood that the interlayer dielectric layer 210 may include one or more dielectric materials or one or more dielectric layers. In some embodiments, the interlayer dielectric layer 210 is formed to a suitable thickness by flowable CVD (FCVD), CVD, HDPCVD, SACVD, spin-on, sputtering, or other suitable methods. For example, an interlayer dielectric material layer (not shown) may be initially formed to cover the gate structure G. Subsequently, a thickness of the interlayer dielectric material layer is reduced until top surfaces 200t of the spacers 200 and 180t of the gate electrode 180 are exposed, so as to form the interlayer dielectric layer 210. The thickness of the interlayer dielectric layer 210 may be adjusted via a chemical mechanical polishing (CMP) process, an etching process, or other suitable processes. The interlayer dielectric layer 210 faces an outer sidewall of the spacers 200, so that within the enclosure delimited by the spacers 200 the gate electrode 180 is exposed. In some embodiments, portions of the spacers 200 (and the gate electrode 180) may also be removed when removing portions of the interlayer dielectric material layer to form the interlayer dielectric layer 210. In some embodiments, when the gate electrode 180 is a replacement gate electrode, the gate electrode 180 may be removed, and substituted with a permanent gate electrode (not shown). In some embodiments, the permanent gate electrode may be formed by depositing a conductive material over the work function metal layer 170 and (optionally) the interlayer dielectric layer 210, and removing part of the conductive material until a top surface of the permanent gate electrode is substantially flush with the top surface 210t of the interlayer dielectric layer 210.

Figure 9:
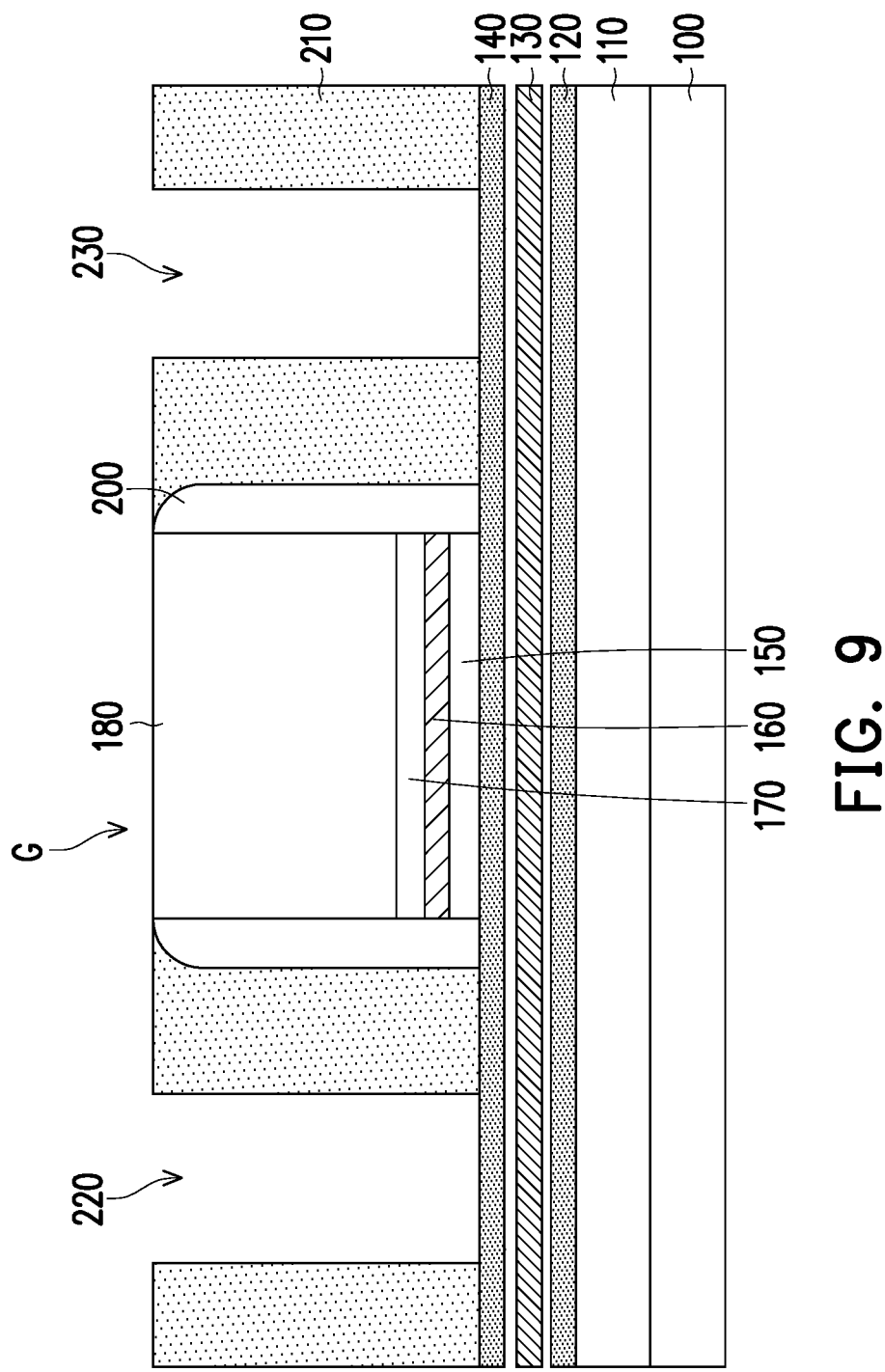
Figure 9B:
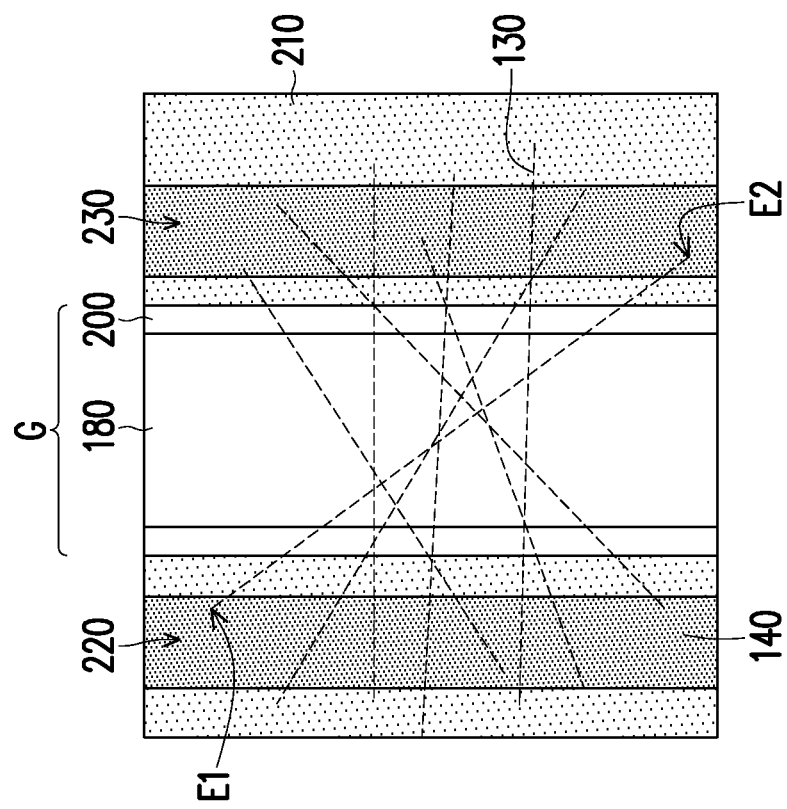
Figure 9A:
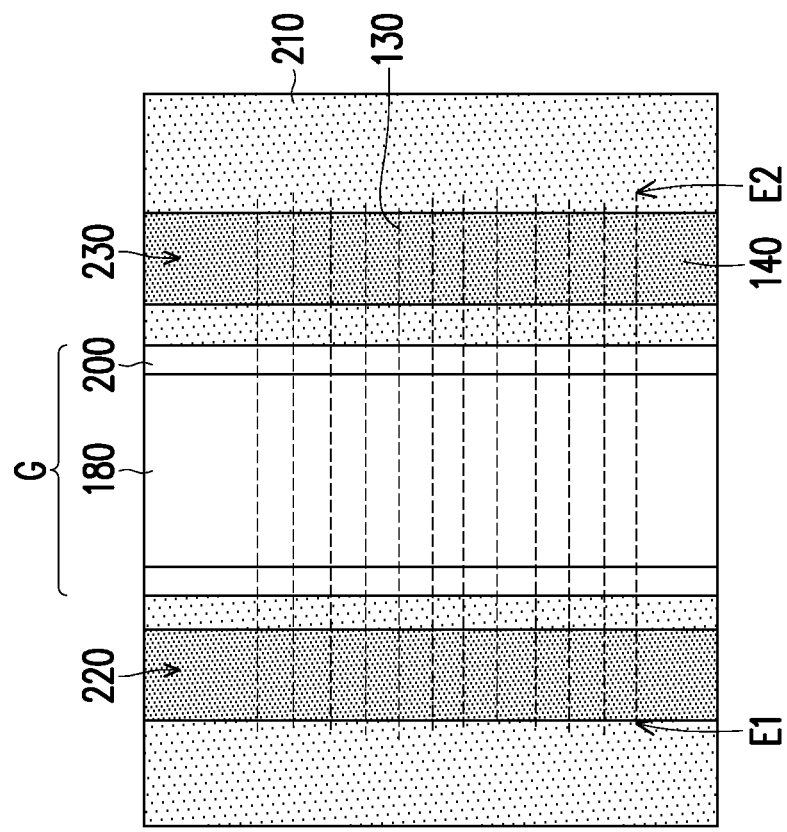

Referring to FIG. 9, FIG. 9A and FIG. 9B, in some embodiments contact holes 220 and 230 are formed on opposite sides of the gate structure G by removing portions of the interlayer dielectric layer 210. In some embodiments, the contact holes 220 and 230 extend vertically (along the thickness direction) through the interlayer dielectric layer 210 exposing the pad layer 140. In some embodiments, the contact holes 220 and 230 may be formed in the interlayer dielectric layer 210 during an etching step. The position of the contact holes 220 and 230 may be set through the use of auxiliary masks (not shown). In some embodiments, the contact hole 220 is located at a first side of the gate structure G and the contact hole 230 is located at an opposite side of the gate structure G. That is, the gate structure G may be disposed in between the contact hole 220 and the contact hole 230. In some embodiments, the contact hole 220 vertically overlaps (is vertically aligned) with portions of the carbon nanotubes 130 close to the first end E1 of the carbon nanotubes 130, and the contact hole 230 vertically overlaps with portions of the carbon nanotubes 130 close the other end E2.

Figure 10:
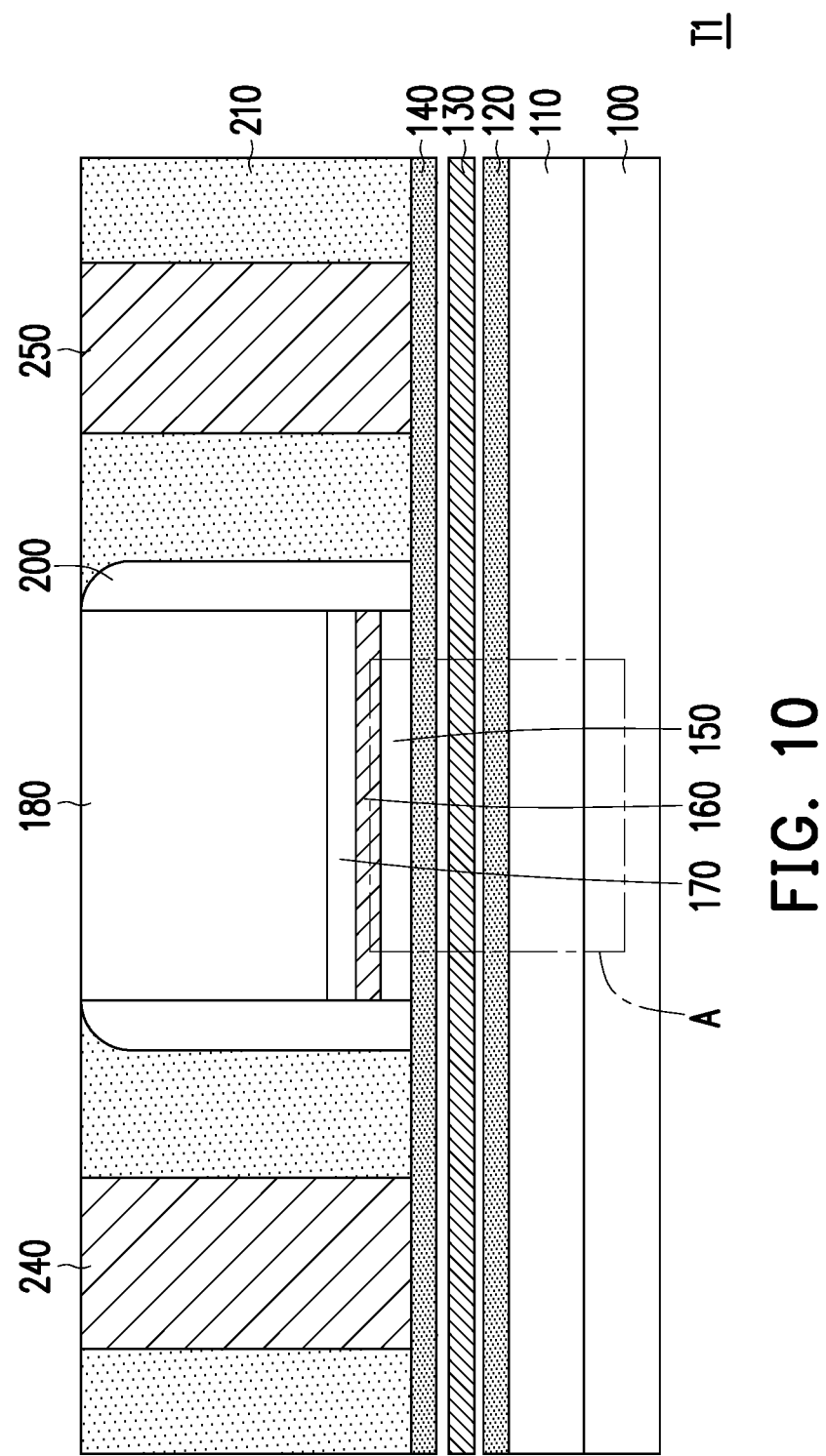

Referring to FIG. 10, FIG. 10A and FIG. 10B, a conductive material may then be filled within the contact holes 220 and 230 to form the contact vias 240 and 250, respectively. The conductive material of the contact vias 240 and 250 may include cobalt (Co), tungsten (W), copper (Cu), titanium (Ti), tantalum (Ta), aluminum (Al), zirconium (Zr), hafnium (Hf), or other suitable metals. In some embodiments, the conductive material of the contact vias 240 and 250 may be cobalt, tungsten or copper. In some embodiments, the conductive material may be formed by using sputtering, chemical vapor deposition (CVD), physical vapor deposition (PVD), atomic layer deposition (ALD), other deposition techniques, or a combination thereof. In some embodiments, the contact vias 240 and 250, the pad layer 140 and the carbon nanotubes 130 may constitute a metal-insulator-semiconductor (MIS) junction. That is, the pad layer 140 may extend in between the contact vias 240 and 250 and the carbon nanotubes 130. In some embodiments, current flow through the MIS junction is possible via tunneling effect between the semiconductor (the carbon nanotubes 130) and the metallic material (the contact vias 240 and 250). In some embodiments, the carbon nanotubes 130 can act as active channels of the transistor T1, with the contact vias 240 and 250 acting as source/drain contacts. In some embodiments, other processes may be performed to integrate the transistor T1 in larger circuits (not shown). In some embodiments, the transistor T1 may have the carbon nanotubes 130 disposed in the aligned configuration (transistor T1A of FIG. 10A) or in the random configuration (transistor T1B of FIG. 10B).

Figure 11A:
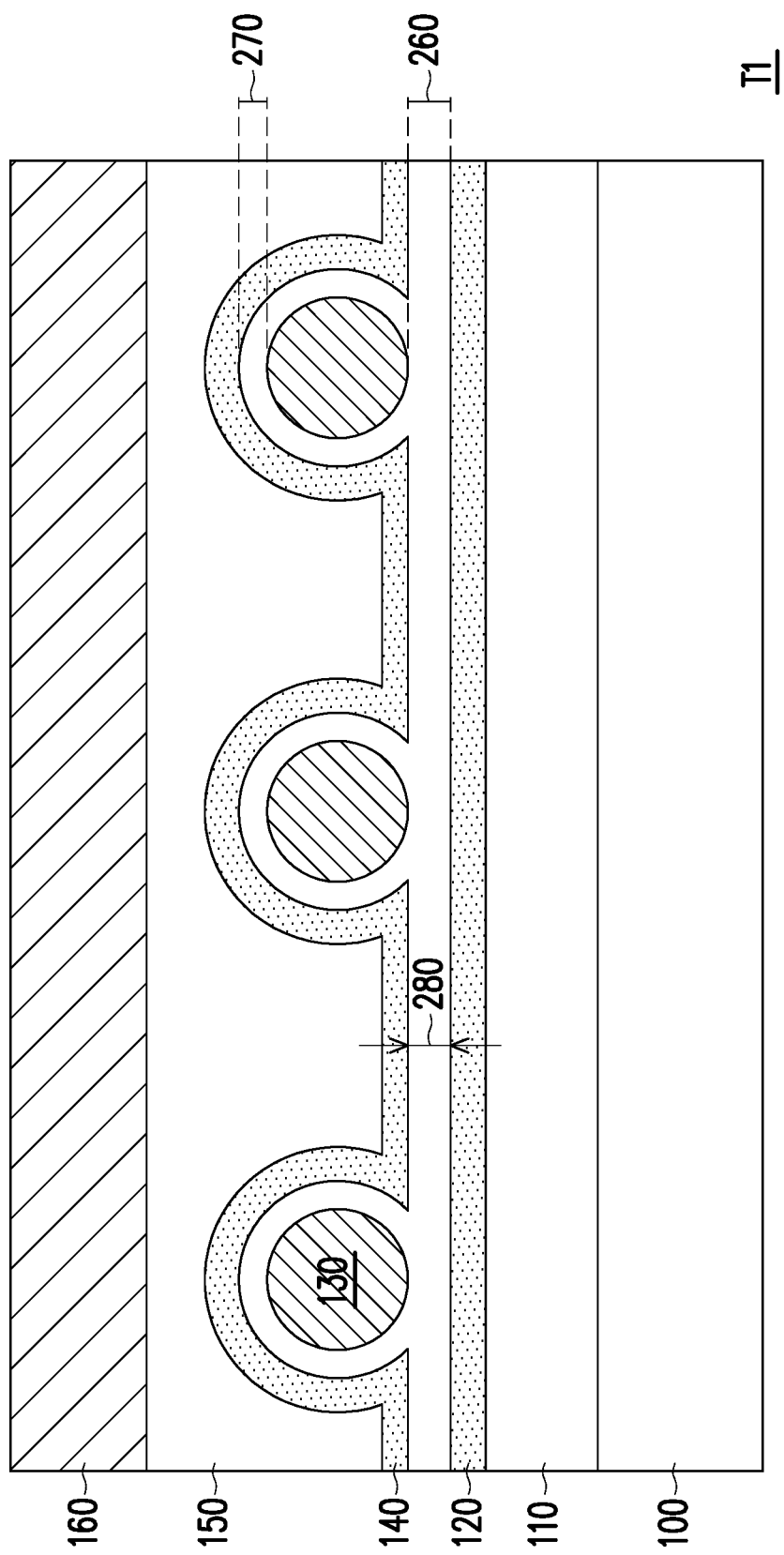
FIG. 11A to FIG. 11D are schematic cross-sectional enlarged views of a portion of a field effect transistor according to some embodiments of the present disclosure.

FIG. 11A to FIG. 11D are cross-sectional views of FETs according to some embodiments of the disclosure. The cross-sectional views of FIG. 11A to FIG. 11D are taken along the line II-II of FIG. 10A or FIG. 10B, and show only the portion of the FETs structure included in the area A of FIG. 10. Referring to FIG. 11A, in some embodiments, because the carbon nanotubes 130, the pad layer 120 and the pad layer 140 are made of atomically flat materials (e.g., materials having a two-dimensional lattice structure with no dangling bonds), van der Waals gaps 260, 270, and 280 may be observed at their interfaces. In some embodiments, a first gap 260 may be formed between the carbon nanotubes 130 and the pad layer 120 and a second gap 270 may be formed between the carbon nanotubes 130 and the pad layer 140. In some embodiments, the first gap 260 may be less than 1 nm, for example in the range from 0.3 to 0.4 nanometers. In some embodiments, the pad layer 140 is conformally disposed over the carbon nanotubes 130, and the second gap 270 may have an arcuated shape, following the profile of the carbon nanotubes. In some embodiments, the presence of the van der Waals gaps 260 and 270 results in semiconductor/ insulator interfaces with little if any traps, improving the electron mobility and, hence, the performances of the transistor T1. In some embodiments, a third gap 280 may exist between the pad layer 120 and the pad layer 140 in the region between adjacent carbon nanotubes 130, (where the pad layer 120 directly overlies the pad layer 140) depending also on the spacing (e.g., the pitch P of FIG. 3A) of the carbon nanotubes 130. In some embodiments, the third gap 280 may be in the range from 0.3 to 0.4.

Figure 11B:
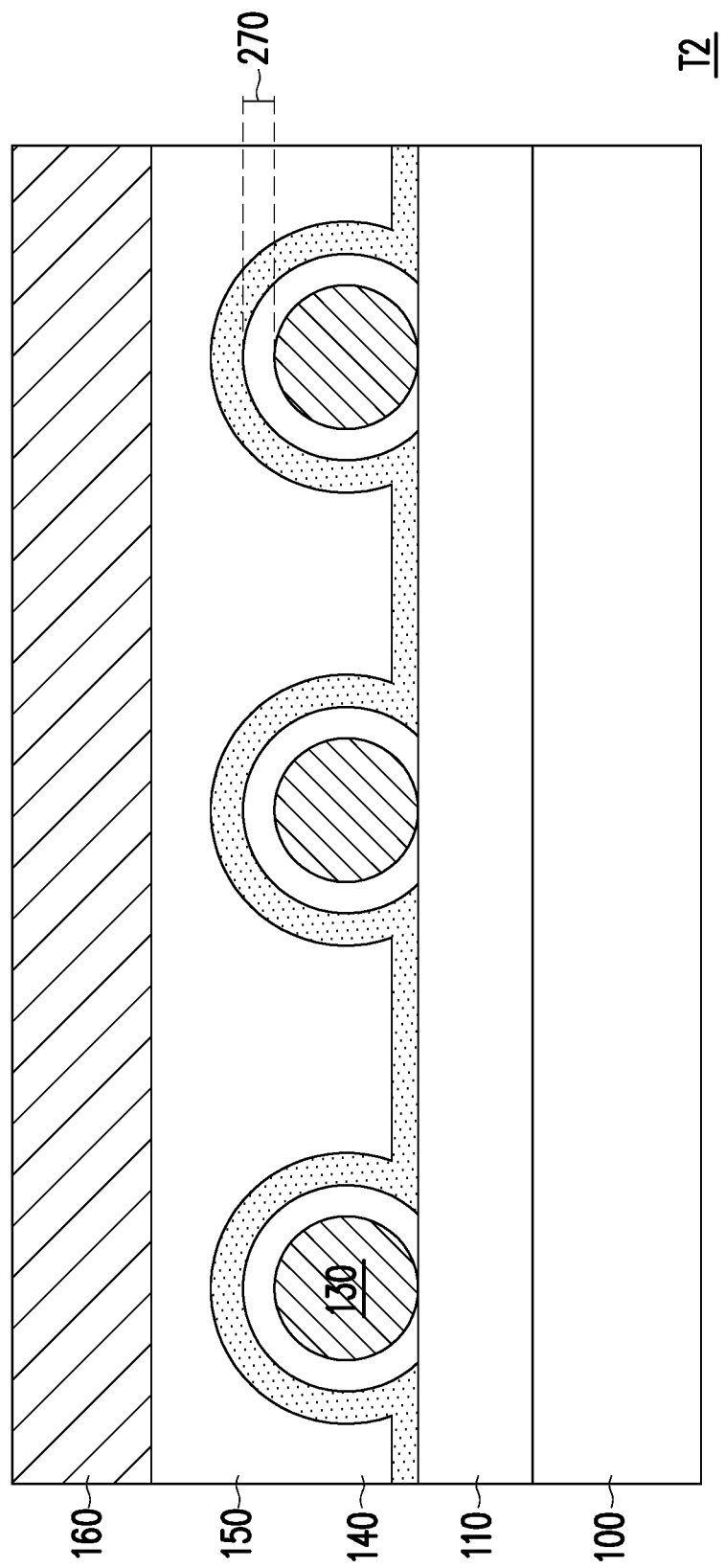
Figure 11C:
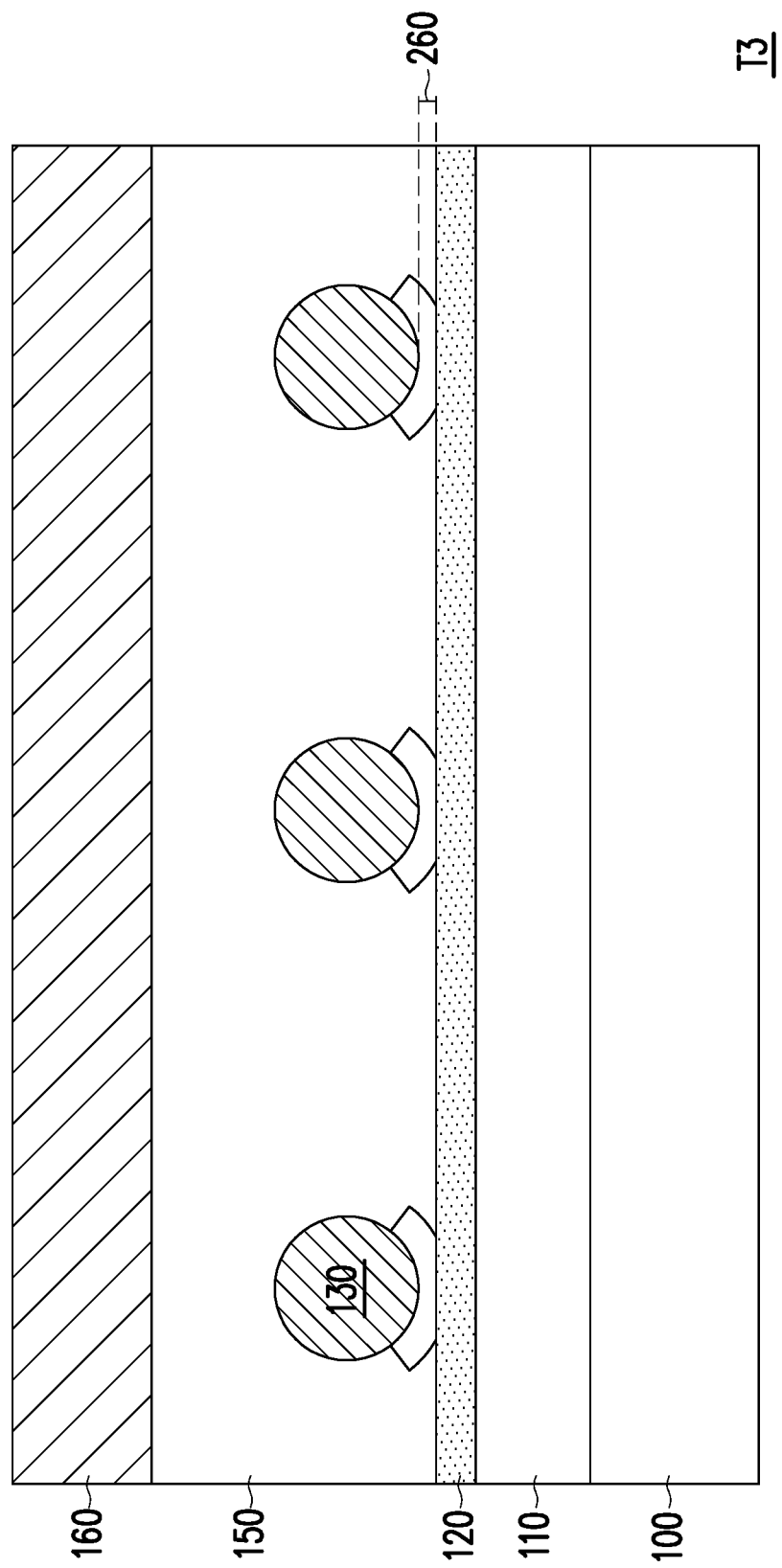

In some embodiments, one of the pad layer 120 or the pad layer 140 may be omitted. For example, as shown in FIG. 11B, in a FET T2 the pad layer 120 (shown in FIG. 11A) is omitted, and the carbon nanotubes 130 are directly disposed on the dielectric layer 110. In these cases, the van der Waals gap 270 is present between the carbon nanotubes 130 and the pad layer 140, while the carbon nanotubes 130 are disposed on the dielectric layer 110. In some alternative embodiments, as shown for the FET T3 of FIG. 11C, the pad layer 140 (shown in FIG. 11A) is omitted, and the insulation material layer 150 is disposed on the carbon nanotubes 130. In these embodiments, the van der Waals gap 260 between the carbon nanotubes 130 and the pad layer 120 is still present. In some embodiments, to manufacture FETs T3 as the one of FIG. 11C, nucleation sites for the deposition of the insulation material layer 150 may be generated by damaging some of the carbon nanotubes 130, or by damaging portions of the pad layer 120 left exposed by the carbon nanotubes 130. In some alternative embodiments, non-conventional deposition process may be used which do not require damaging the carbon nanotubes 130 or the pad layer 120. For example, the carbon nanotubes 130 may be subjected to a mild functionalization treatment in presence of nitrogen dioxide, or selected combinations of dielectric materials may be deposited by alternating low temperature deposition steps and high temperature deposition steps, possibly without requiring functionalization of the carbon nanotubes 130.

Figure 11D:
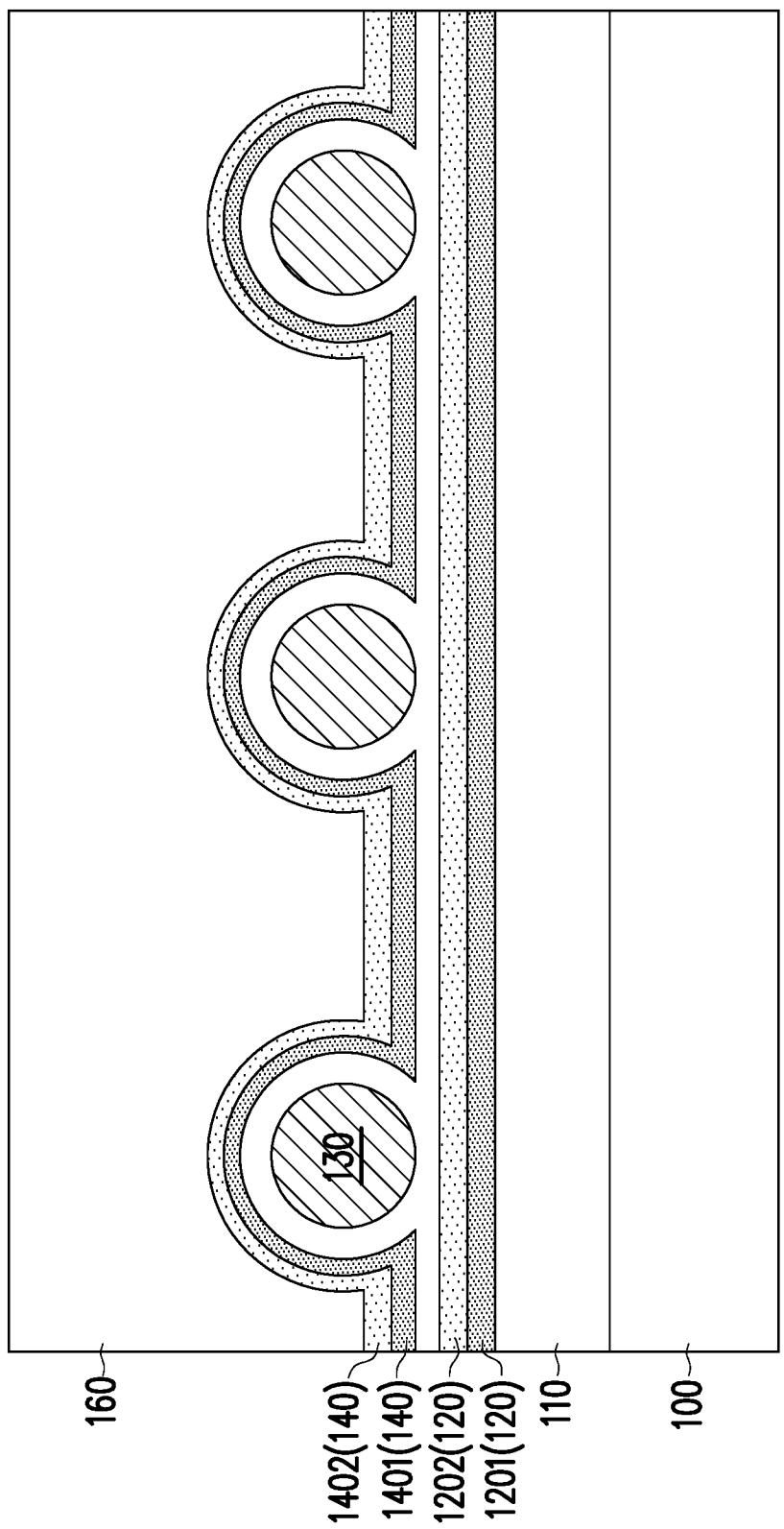

In some embodiments, as shown for the transistor T4 of FIG. 11D, the pad layer 120 and the pad layer 140 may be multilayered structures, for example including multiple sheets 1201, 1202 or 1401, 1402 of 2D materials. In some embodiments, the 2D materials are bidimensional insulator materials. Therefore, a first sheet 1201 of the first pad layer 102 may be disposed between the second sheet 1202 and the dielectric layer 110, and the second sheet 1202 may be disposed between the first sheet 1201 and the carbon nanotubes 130. Similarly, a first sheet 1401 of the pad layer 140 may be disposed between the carbon nanotubes 130 and the second sheet 1402, and the second sheet 1402 may be disposed between the first sheet 1401 and the upper dielectric layers (e.g., the high-k dielectric layer 160). In some embodiments, the sheets 1201, 1202, 1401 and 1402 may be individually transferred during multiple transfer steps. In some embodiments, the insulation material layer 150 may be omitted, and the high-k dielectric layer 160 may be formed directly on the pad layer 140.

Figure 12A:
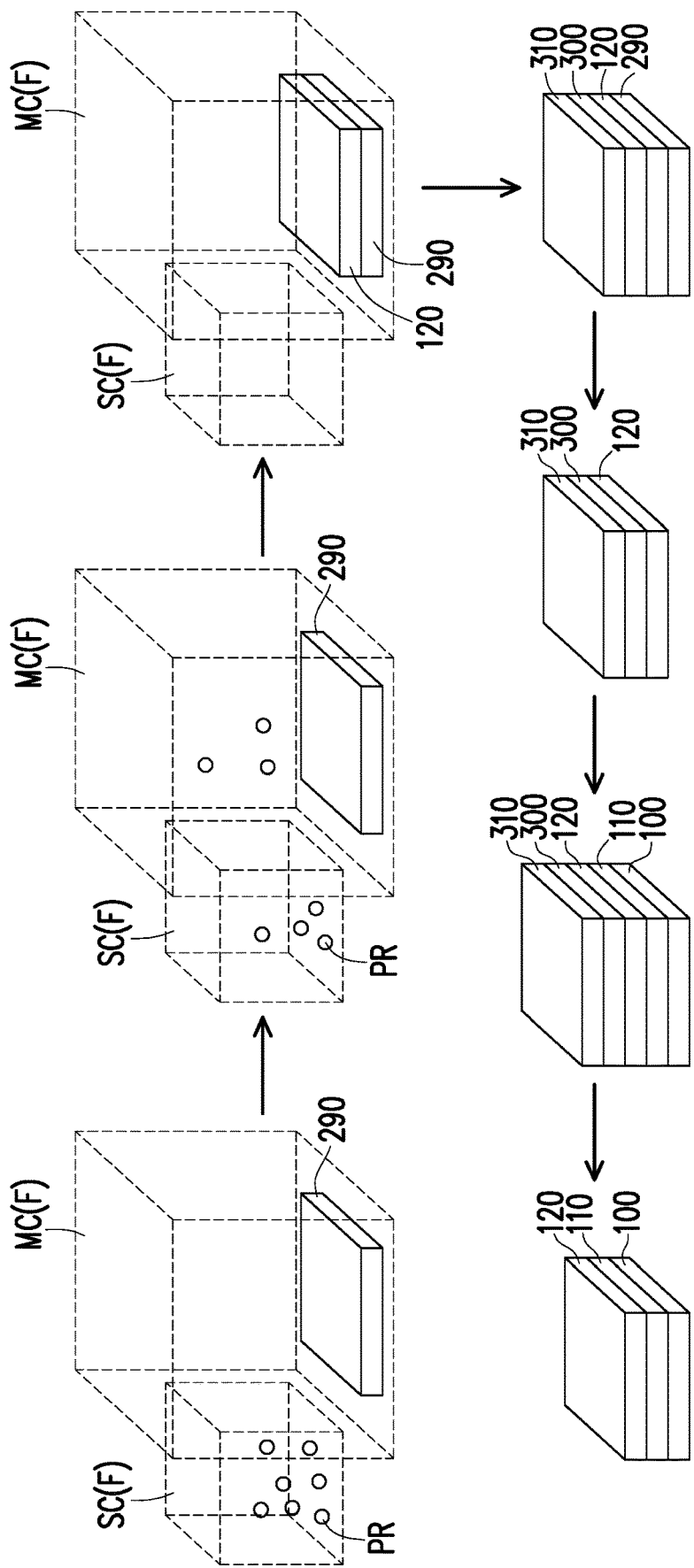
FIG. 12A is a schematic representation of a growth process and a transfer process for a pad layer according to some embodiments of the present disclosure.

FIG. 12A is a schematic representation of a growth process and a transfer process for a pad layer 120 or 140 according to some embodiments of the present disclosure. For example, the pad layer 120 may be grown in furnaces using low-pressure chemical vapor deposition and subsequently transferred on the dielectric layer 110. In some embodiments, a growth substrate 290 is provided. In some embodiments, Cu(111)/sapphire may be used as the growth substrate 290. In some embodiments, the growth substrate 290 may be annealed (e.g., above 1000° C. for about 1 hour) in a non-oxidizing atmosphere (e.g., under hydrogen flow) before growing the hexagonal boron nitride film. The growth substrate 290 may be placed in a main chamber MC of a furnace F. The furnace F may be evacuated to a low base pressure (e.g., about 5 Torr). A precursor PR (e.g., ammonia borane in case of hexagonal boron nitride) may be loaded into a sub-chamber SC of the furnace F at the upstream side of the main chamber MC. In an initial stage of the process, the sub-chamber SC and the main chamber MC may be not in fluid communication, so that the precursor PR cannot enter the main chamber MC. The sub-chamber SC with the precursor PR may be heated, for example at about 85° C. In some embodiments, the precursor PR is pre-heated in the sub-chamber SC for a certain time (e.g., 30 min), before being introduced in the main chamber MC where the growth substrate 290 is located to grow the pad layer 120 on the growth substrate 290. After growing the pad layer 120, the sub-chamber SC is sealed again from the main chamber MC, and the main chamber MC may be naturally cooled to room temperature under a non-oxidizing atmosphere (e.g., under hydrogen flow). The pad layer 120 may then be detached by the growth substrate 290, for example by electrochemical delamination. In some embodiments, the pad layer 120 may be transferred over the substrate 100 via a sacrificial tape. In some embodiments, the sacrificial tape includes a sacrificial film 300 and an adhesive tape 310. In some embodiments, the sacrificial film 300 is a polymeric film. For example, the sacrificial film 300 may include PMMA. The adhesive tape 310 (e.g., a thermal release tape) may be provided on the sacrificial film 300 to avoid folding during transport. Electrochemical delamination may be performed in an electrolyte solution (e.g., about 1M aqueous sodium hydroxide), using a metal layer in the growth substrate 290 as the cathode and a second metal foil (e.g., platinum, not shown) as the anode, and applying a voltage (e.g., 4V). During the electrochemical delamination, the pad layer 120 with the sacrificial film 300 and the adhesive tape 310 stacked on top may detach from the growth substrate 290. In some embodiments, gas may be generated at the interface between the growth substrate 290 and the pad layer 120, promoting detachment from the growth substrate 290. After detachment, the pad layer 120 (still having the sacrificial film 300 and the adhesive tape 310 on top) may be placed on the target substrate (e.g., on the dielectric layer 110). The adhesive tape 310 and the sacrificial film 300 may then be sequentially removed, for example through a heating process and a washing process, leaving the pad layer 120 over the substrate 100.

Figure 12B:
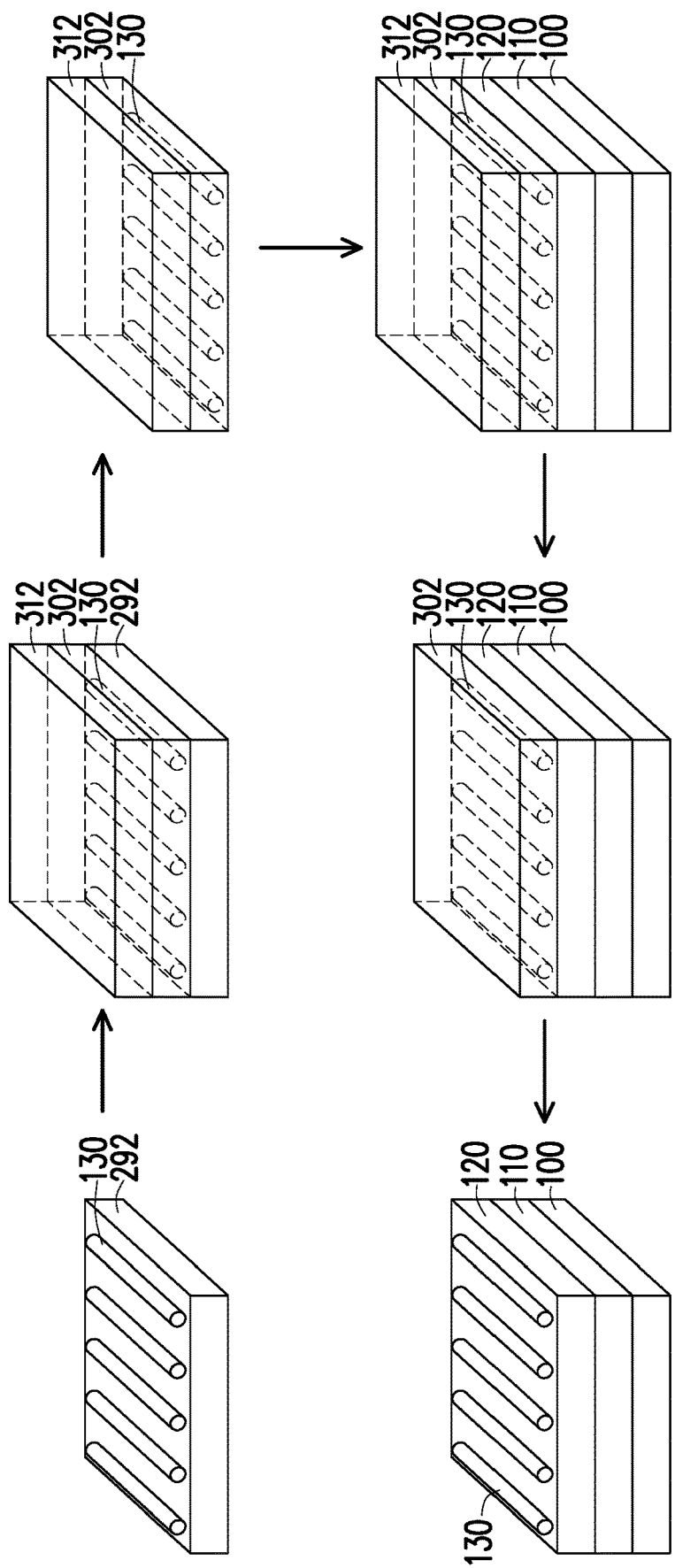
FIG. 12B is a schematic representation of a transfer process of carbon nanotubes according to some embodiments of the present disclosure.

In some embodiments, referring to FIG. 12B, to produce a device of the aligned configuration, the carbon nanotubes 130 may be grown via CVD on a growth support 292 (e.g., a quartz plate) at elevated temperatures (e.g., greater than 800° C.) by reaction of a carbon containing gas (e.g., methane) with a reactive gas (e.g., hydrogen) in presence of a catalyst (e.g., suitable forms of iron). In some embodiments, the carbon nanotubes 130 may grow aligned on the growth support 292, and may be transferred on the pad layer 120 without significant loss of the original alignment. In some embodiments, the transfer from the growth support 292 to the pad layer 120 is performed by embedding the carbon nanotubes 130 in a sacrificial tape. In some embodiments, the sacrificial tape may include a sacrificial film 302 and an adhesive tape 312. In some embodiments, the sacrificial film 302 may be a metal layer (e.g., nickel or copper), and the adhesive tape 312 may be a thermal release layer. The carbon nanotubes 130 may be embedded in the sacrificial film 302, and the sacrificial film 302 and the adhesive tape 312 may be peeled from the growth support 292 and applied on the pad layer 120. Thereafter, the adhesive tape 312 and the sacrificial film 302 may be sequentially removed, for example via a heating step, a descum step, and a metal etch step to leave the carbon nanotubes 130 on the pad layer 120. In some embodiments, carbon nanotubes 130 from multiple separate supports (not shown) may be transferred on the same pad layer 120. In some embodiments, when the pad layer 120 is not included the carbon nanotubes 130 may be transferred on the dielectric layer 110.

In some embodiments, to produce a device of the random configuration, the processed semiconductor substrate 100 may be exposed to a dispersion of carbon nanotubes 130 in a suitable solvent. For example, the carbon nanotubes 130 may be dispersed in a chlorinated solvent (e.g., 1,2-dichloroethane). In some embodiments, several sonication steps may be required to disperse the carbon nanotubes 130. In some embodiments, a vacuum annealing step may be performed after the carbon nanotubes 130 are deposited on the pad layer 120.

Figure 13:
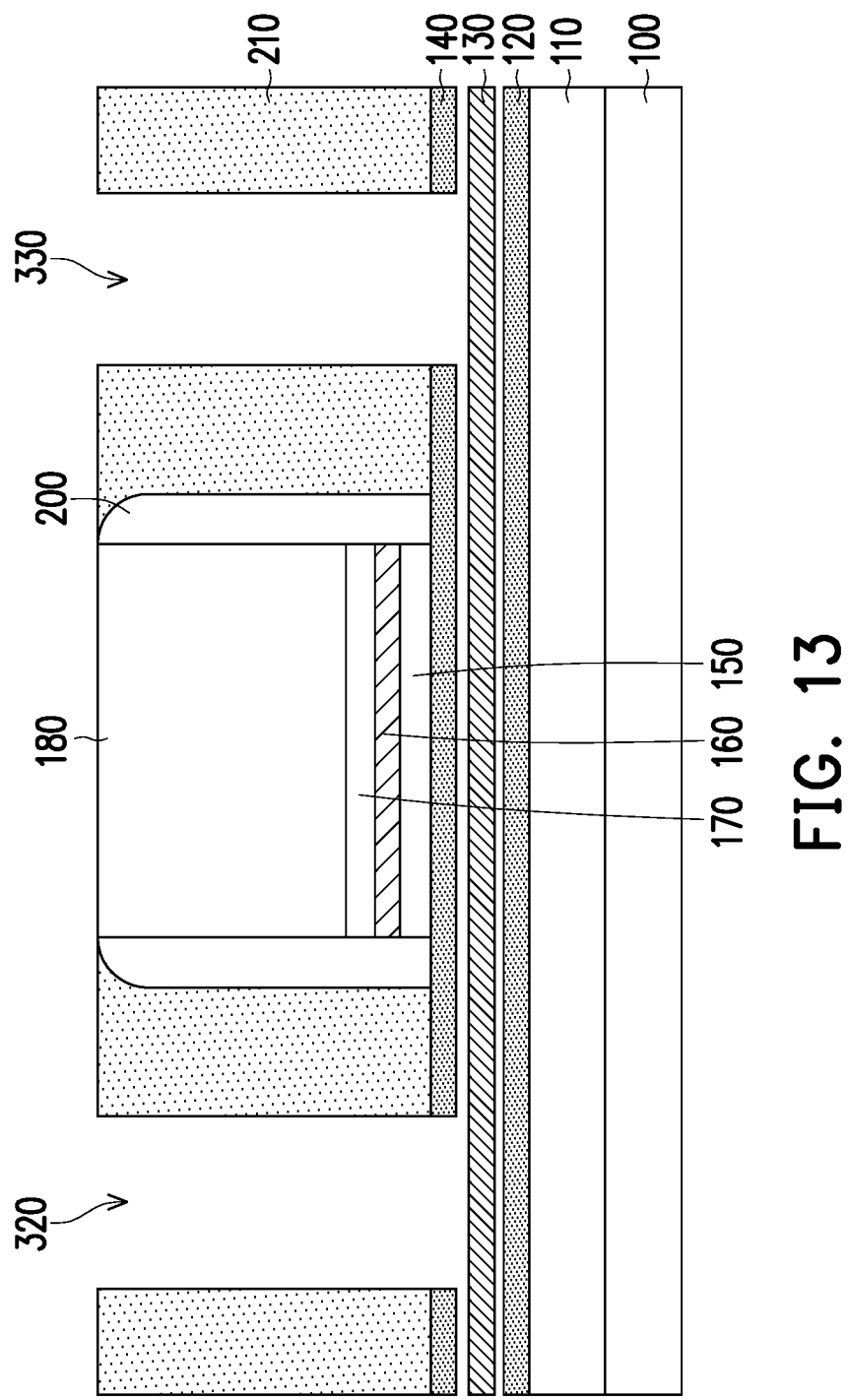
FIG. 13 and FIG. 14 are schematic cross-sectional views of structures produced during a manufacturing method of a field effect transistor according to some embodiments of the present disclosure.
Figure 13B:
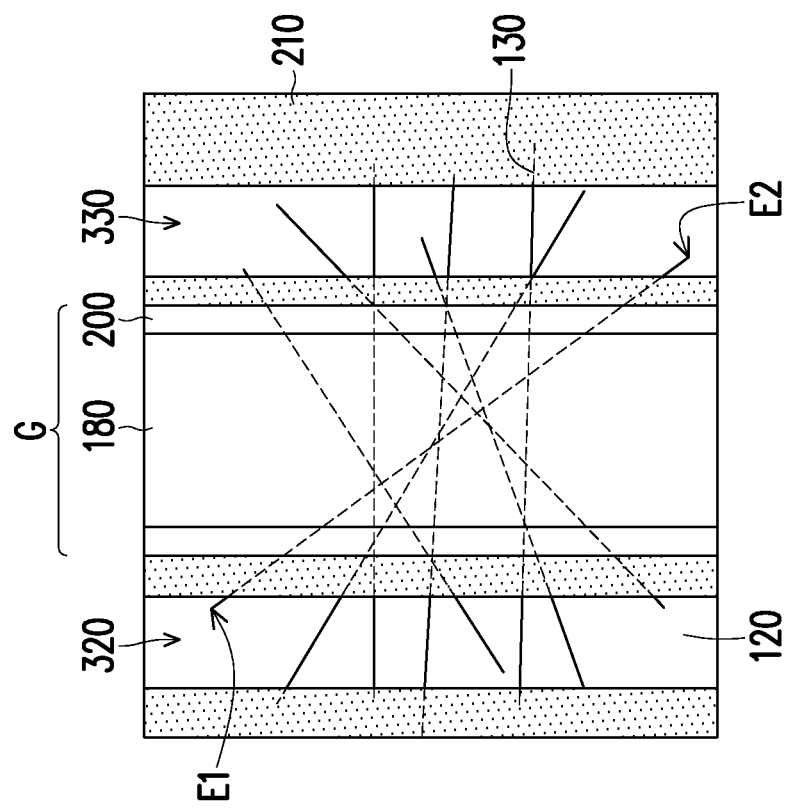
FIG. 13B is a schematic top view of a structure shown in FIG. 13 according to some embodiments of the present disclosure.
Figure 13A:
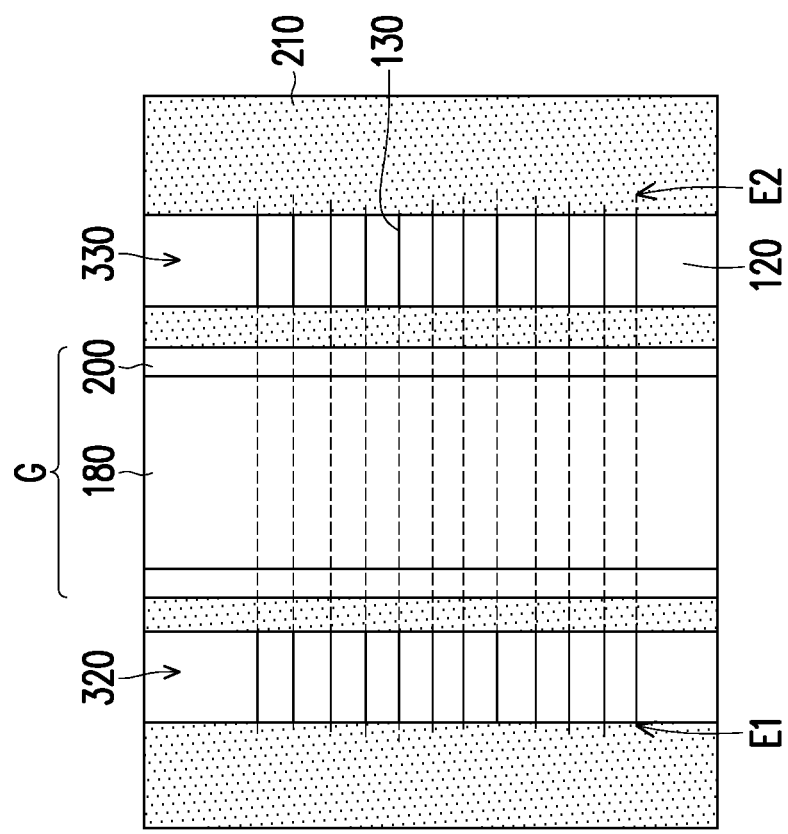
FIG. 13A is a schematic top view of a structure shown in FIG. 13 according to some embodiments of the present disclosure.
Figure 14:
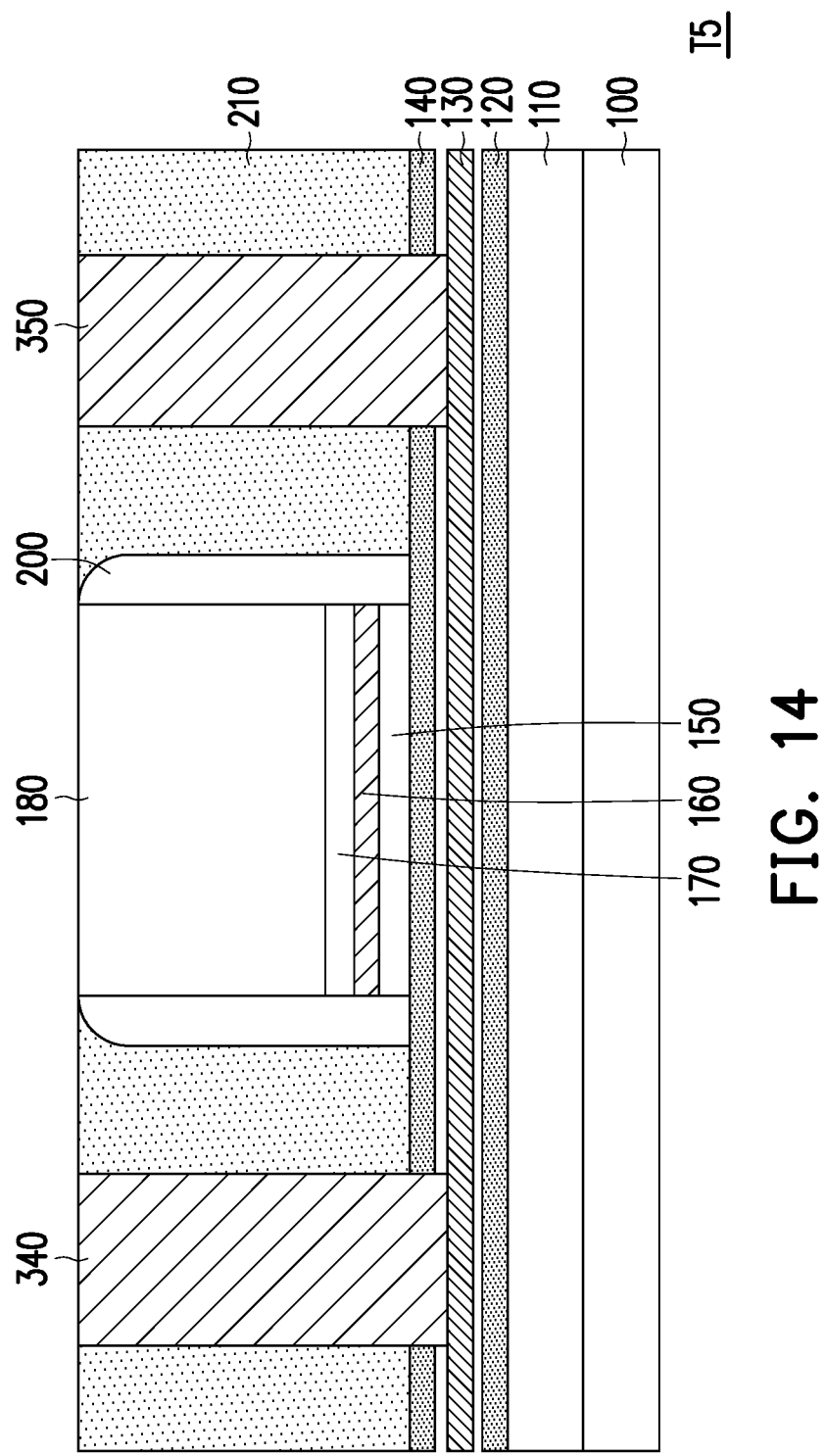

FIG. 13 and FIG. 14 are schematic cross-sectional views of structures produced during a manufacturing method of a FET T5 (shown in FIG. 14A) according to some embodiments of the present disclosure. FIG. 13A is a schematic top view of the structure illustrated in the corresponding view of FIG. 13 according to some embodiments of the disclosure. FIG. 13B is a schematic top view of the structure illustrated in the corresponding view of FIG. 13 according to some alternative embodiments of the disclosure. In some embodiments, the structure illustrated in FIG. 13 may be obtained from the structure illustrated in FIG. 8 by opening contact holes 320 and 330 on opposite sides of the gate structure G, similarly to what was previously disclosed for the contact holes 220 and 230. In some embodiments, a portion of the pad layer 140 (e.g., illustrated in FIG. 8) may be removed, to form contact holes 320 and 330 extending through the pad layer 142 and exposing portions of the pad layer 120 and portions of the carbon nanotubes 130 close to the extremities E1 and E2 (represented as solid lines in FIG. 13A and FIG. 13B). Thereafter, the contact holes 320 and 330 may be filled with a conductive material to form contact vias 340 and 350, respectively. As such, the contact vias 340 and 350 extend through the pad layer 142 to directly contact the carbon nanotubes 130. In some embodiments, the conductive material may be deposited via physical vapor deposition. In some embodiments, the polarity (e.g., nFET or pFET) can be determined by selecting the metal work function. For example, pFETs may use high work function metals like Pd, Pt, or Ni, and nFETs may use low work function metals, such as Zr, Hf, Sc, Er, or La.

Figure 15:
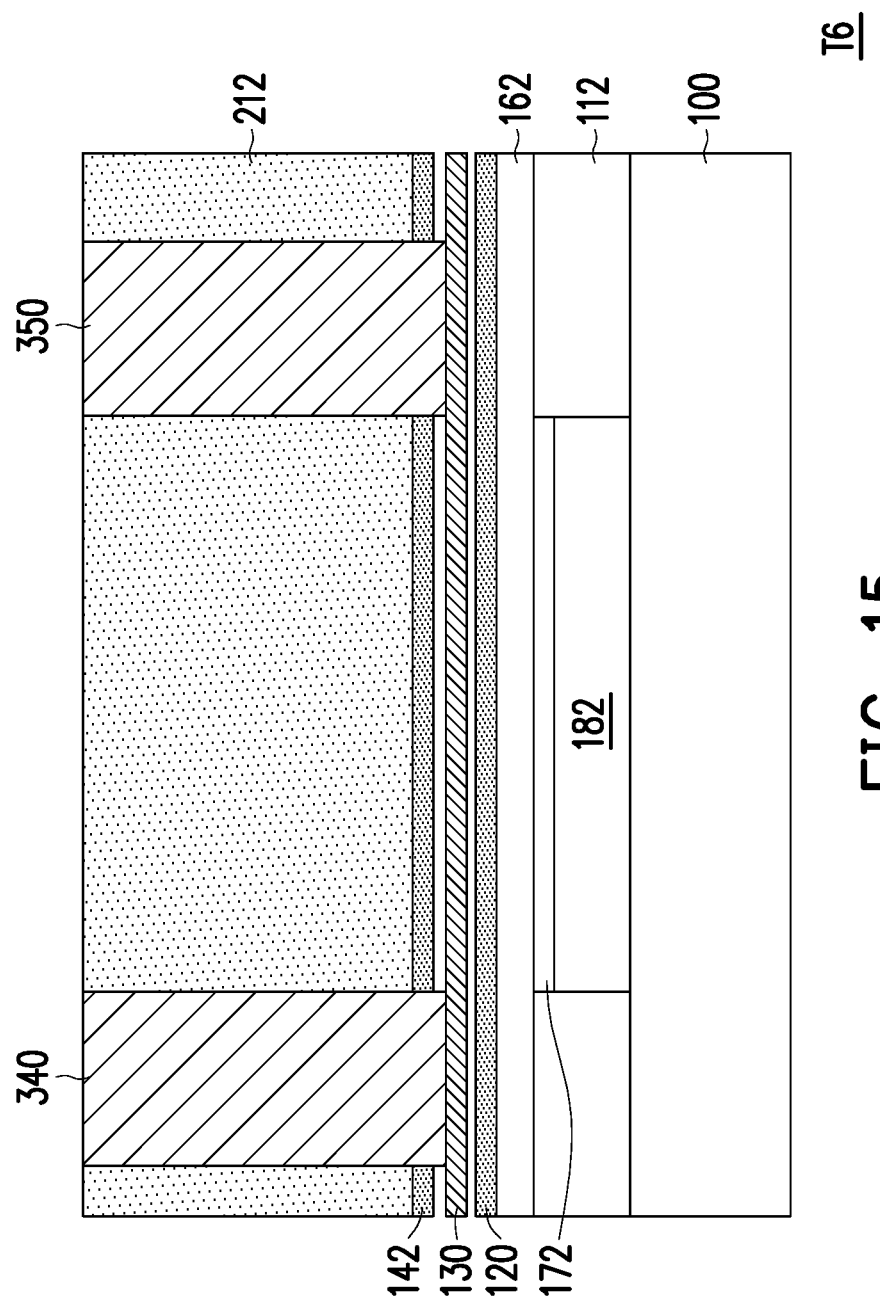
FIG. 15 is a schematic cross-sectional view of a field effect transistor according to some embodiments of the present disclosure.

FIG. 15 shows a cross-sectional view of a FET T6 according to some embodiments of the disclosure. The FET T6 is a back-gated FET, in which the gate structure is disposed between the carbon nanotubes 130 and the substrate 100. In some embodiments, the gate electrode 182 is formed on a portion of the substrate 100. The work function metal layer 172 may be stacked over the gate electrode 182, and the dielectric layer 112 may laterally wrap the gate electrode 182 and the work function metal layer 172. That is, the gate electrode 182 and the work function metal layer 172 may be embedded in the dielectric layer 112. The high-k dielectric layer 162 may be blanketly disposed on the work function metal layer 172 and the dielectric layer 112. The pad layer 120 is stacked on the high-k dielectric layer 162, and the carbon nanotubes 130 are disposed on the pad layer 120. The pad layer 142 is disposed on the carbon nanotubes 142 on an opposite side with respect to the pad layer 140. The inter-layer dielectric layer 212 is then disposed on the pad layer 142. The pad layer 142 may be patterned to expose portions of the carbon nanotubes 130 on opposite sides of the gate electrode 182. Contact vias 340 and 350 may extend through the inter-layer dielectric layer 212 and (optionally) the pad layer 142 to contact the carbon nanotubes 130.

According to some embodiments, a field effect transistor includes a semiconductor substrate, a first pad layer, carbon nanotubes and a gate structure. The first pad layer is disposed over the semiconductor substrate and comprises a 2D material. The carbon nanotubes are disposed over the first pad layer. The gate structure is disposed over the carbon nanotubes.

According to some embodiments, a field effect transistor includes a semiconductor substrate, carbon nanotubes, a gate structure and contact vias. The carbon nanotubes are sandwiched between a pair of pad layers. The gate structure is disposed over the carbon nanotubes. The contact vias are disposed on opposite sides of the gate structure. A first contact via of the contact vias overlaps with first ends of the carbon nanotubes, and a second contact via of the contact vias overlaps with second ends of the carbon nanotubes. The pair of pad layers includes hexagonal boron nitride.

According to some embodiments, a method of manufacturing a field effect transistor includes the following steps. A first pad layer is provided over a substrate. The first pad layer includes a bidimensional insulator material. Carbon nanotubes are provided over the first pad layer. A gate structure is formed over the substrate. The carbon nanotubes and the gate structure are stacked, and the carbon nanotubes extend beyond opposite sides of the gate structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A field effect transistor, comprising:
a semiconductor substrate;
carbon nanotubes sandwiched between a pair of pad layers;
a gate structure disposed over the carbon nanotubes; and
contact vias disposed on opposite sides of the gate structure,
wherein a first contact via of the contact vias overlaps with first ends of the carbon nanotubes, and a second contact via of the contact vias overlaps with second ends of the carbon nanotubes,
wherein the pair of pad layers includes hexagonal boron nitride, and
wherein a first pad layer of the pad layers extends between the first and second contact vias and the carbon nanotubes, completely separating the first and second contact vias from the carbon nanotubes.

2. The field effect transistor of claim 1, wherein the carbon nanotubes are disposed in a random configuration.

3. The field effect transistor of claim 1, wherein the carbon nanotubes are disposed in an aligned configuration.

4. The field effect transistor of claim 1, wherein a van der Waals gap separates the first pad layer from a second pad layer of the pair of pad layers where the first pad layer directly overlies the second pad layer.

5. The field effect transistor of claim 1, wherein the first pad layer includes a first sheet and a second sheet, the first sheet is disposed between the first and second contact vias and the second sheet, and the second sheet is disposed between the first sheet and the carbon nanotubes.

6. The field effect transistor of claim 1, wherein a second pad layer of the pair of pad layers includes a first sheet and a second sheet, the first sheet is disposed between the semiconductor substrate and the second sheet and the second sheet is disposed between the first sheet and the carbon nanotubes.

7. The field effect transistor of claim 1, wherein each pad layer of the pair of pad layers is made of a monolayer of hexagonal boron nitride.

8. A field effect transistor, comprising:
a semiconductor substrate;
carbon nanotubes sandwiched between a pair of pad layers;
a gate structure disposed over the carbon nanotubes; and
contact vias disposed on opposite sides of the gate structure,
wherein a first contact via of the contact vias overlaps with first ends of the carbon nanotubes, and a second contact via of the contact vias overlaps with second ends of the carbon nanotubes,
wherein the pair of pad layers includes hexagonal boron nitride,
wherein a first pad layer of the pair of pad layers spans from the first and second contact vias to the carbon nanotubes, completely separating the first and second contact vias from the carbon nanotubes, and
wherein the carbon nanotubes are semiconducting carbon nanotubes.

9. The field effect transistor of claim 8, wherein a van der Waals gap separates the carbon nanotubes from the first pad layer.

10. The field effect transistor of claim 8, wherein during usage, electric current from the first contact via to the second contact via flows through the carbon nanotubes.

11. The field effect transistor of claim 8, wherein extending directions of the carbon nanotubes intersect with each other.

12. The field effect transistor of claim 11, wherein the carbon nanotubes do not overlap with each others.

13. The field effect transistor of claim 8, wherein the gate structure contacts a second pad layer of the pair of pad layers disposed at an opposite side of the carbon nanotubes with respect to the first pad layer.

14. A field effect transistor, comprising:
a semiconductor substrate;
carbon nanotubes sandwiched between a pair of pad layers;
a gate structure disposed over the carbon nanotubes; and
contact vias disposed on opposite sides of the gate structure,
wherein a first contact via of the contact vias overlaps with first ends of the carbon nanotubes, and a second contact via of the contact vias overlaps with second ends of the carbon nanotubes,
wherein the pair of pad layers includes hexagonal boron nitride,
wherein a first pad layer of the pad layers extends from the first and second contact vias to the carbon nanotubes, completely separating the first and second contact vias from the carbon nanotubes, and
wherein the carbon nanotubes extend parallel to each other along a first direction, the first ends are disposed on one side of the gate structure, the second ends are disposed at an opposite side of the gate structure, and the gate structure overlaps central regions of the carbon nanotubes joining the first ends to the corresponding second ends.

15. The field effect transistor of claim 14, wherein the carbon nanotubes are disposed separated by a pitch along a second direction perpendicular to the first direction.

16. The field effect transistor of claim 14, wherein the gate structure comprises a stacked strip and a gate electrode stacked over the first pad layer of the pair of pad layers.

17. The field effect transistor of claim 16, wherein the gate structure comprises spacers extending at opposite sidewalls of the gate electrode, and the stacked strip and the gate electrode contact inner sidewalls of the spacers.

18. The field effect transistor of claim 17, wherein the stacked strip comprises an insulation material layer, a high-k dielectric layer, and a work function metal layer, sequentially stacked between the first pad layer and the gate electrode and contacting the inner sidewalls of the spacers.

19. The field effect transistor of claim 17, further comprising an interlayer dielectric layer contacting the first pad layer in between the contact vias and outer sidewalls of the spacers, wherein the outer sidewalls are opposite to the inner sidewalls.

20. The field effect transistor of claim 14, wherein the carbon nanotubes have semiconducting character.

* * * * *